United States Patent
Yamashita et al.

(10) Patent No.: US 9,461,207 B2
(45) Date of Patent: Oct. 4, 2016

(54) LIGHT EMITTING DEVICE, AND PACKAGE ARRAY FOR LIGHT EMITTING DEVICE

(75) Inventors: Ryohei Yamashita, Tokushima (JP); Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 13/820,350

(22) PCT Filed: Sep. 1, 2011

(86) PCT No.: PCT/JP2011/069918
§ 371 (c)(1),
(2), (4) Date: Mar. 1, 2013

(87) PCT Pub. No.: WO2012/029912
PCT Pub. Date: Mar. 8, 2012

(65) Prior Publication Data
US 2013/0153952 A1 Jun. 20, 2013

(30) Foreign Application Priority Data

Sep. 3, 2010 (JP) ................................. 2010-198372
Nov. 11, 2010 (JP) ................................. 2010-253161

(51) Int. Cl.
*H01L 33/00* (2010.01)
*H01L 33/38* (2010.01)
(Continued)

(52) U.S. Cl.
CPC ............... *H01L 33/38* (2013.01); *H01L 24/97* (2013.01); *H01L 33/62* (2013.01); *H05K 1/0313* (2013.01); *H01L 33/486* (2013.01); *H01L 2224/48091* (2013.01); *H01L 2224/48247* (2013.01);
(Continued)

(58) Field of Classification Search
USPC ...................................................... 257/98–99
See application file for complete search history.

(56) References Cited

U.S. PATENT DOCUMENTS

| | | | |
|---|---|---|---|
| 2007/0241362 A1* | 10/2007 | Han et al. | 257/100 |
| 2008/0258168 A1 | 10/2008 | Loh et al. | |
| 2009/0315068 A1* | 12/2009 | Oshio et al. | 257/103 |
| 2010/0001308 A1 | 1/2010 | Park et al. | |
| 2010/0163920 A1* | 7/2010 | Itai | 257/99 |
| 2011/0210354 A1 | 9/2011 | Ichikawa et al. | |

FOREIGN PATENT DOCUMENTS

| | | |
|---|---|---|
| JP | 2000-196000 A | 7/2000 |
| JP | 2000196000 A * | 7/2000 |

(Continued)

OTHER PUBLICATIONS

Extended European Search Report of the corresponding European Application No. 11821927.8, dated Apr. 3, 2014.

*Primary Examiner* — John C Ingham
*Assistant Examiner* — Frederick B Hargrove
(74) *Attorney, Agent, or Firm* — Global IP Counselors, LLP

(57) ABSTRACT

A light emitting device includes a substantially cuboid package and a light emitting element. The package is made up of a molded article, and first and second leads each embedded in the molded article. The first lead has a first terminal component exposed at the boundary between a first side face, a bottom face, and a rear face contiguous with the bottom face and opposite a light emission face. The second lead has a second terminal component exposed at the boundary between a second side face opposite the first side face, the bottom face, and the rear face. The first terminal component has a first terminal concavity whose opening is contiguous with the first side face, the bottom face, and the rear face. The second terminal component has a second terminal concavity whose opening is contiguous with the second side face, the bottom face, and the rear face.

15 Claims, 28 Drawing Sheets

(51) Int. Cl.
*H01L 33/62* (2010.01)
*H05K 1/03* (2006.01)
*H01L 23/00* (2006.01)
*H01L 33/48* (2010.01)

(52) U.S. Cl.
CPC ............ *H01L2224/48257* (2013.01); *H01L 2924/01019* (2013.01); *H01L 2924/12041* (2013.01); *H01L 2924/12042* (2013.01)

FOREIGN PATENT DOCUMENTS

| | | |
|---|---|---|
| JP | 2008-187428 A | 8/2008 |
| JP | 2010-003743 A | 1/2010 |
| JP | 2010-062272 A | 3/2010 |
| JP | 2010062272 A * | 3/2010 |
| JP | 2010-135706 A | 6/2010 |
| WO | 2008-153043 A1 | 12/2008 |

* cited by examiner

LIGHT EMITTING DEVICE, AND PACKAGE ARRAY FOR LIGHT EMITTING DEVICE

CROSS-REFERENCE TO RELATED APPLICATIONS

This application claims priority to Japanese Patent Application No. 2010-198372 filed on Sep. 3, 2010 and Japanese Patent Application No. 2010-253161 filed on Nov. 11, 2010, the disclosures of which are hereby incorporated herein by reference in their entirety.

TECHNICAL FIELD

The present invention relates to a light emitting device comprising a light emitting element, and to a package array for light emitting device.

BACKGROUND INFORMATION

Light emitting devices comprising a light emitting element (such as a light emitting diode or a laser diode) have been widely used in the past as the light source for LCD television backlights, lighting fixtures, optical communications devices, and so forth. This light emitting device is mounted on the mounting face of a mounting board.

Light emitting devices are generally classified as either a top-view type or a side-view type, according to the direction in which the light emitted by the light emitting element is taken off. With a top-view type of light emitting device, the emitted light from a light emitting element 10 is taken off in a direction perpendicular to the mounting face. With a side-view type of light emitting device, the emitted light from the light emitting element is taken off in a direction that is parallel to the mounting face.

Here, with a top view type of light emitting device, a method has been proposed in which the four corners of the light emitting device on the mounting board side are fixed to the mounting board (see Japanese Laid-Open Patent Application Publication No. 2010-62272).

More specifically, the light emitting device of Japanese Laid-Open Patent Application Publication No. 2010-62272 has a bottom face that is formed in a cuboid shape and comes into contact with the mounting face, a top face that is the light emission face and is opposite the bottom face, and four side faces that are contiguous with the top and bottom faces. Four terminals are exposed at the four corners formed by the bottom face and the four side faces, and these four terminals are fixed via solder to the mounting board. This allows a top view type of light emitting device to be securely fixed to a mounting board.

SUMMARY

However, when the method of Japanese Laid-Open Patent Application Publication No. 2010-62272 is applied to a side view type of light emitting device, there is the risk of a decrease in the amount of light of the light emitting device. More specifically, with a side view type of light emitting device, one of the four side faces (hereinafter referred to as the "front face") serves as the light emission face, and light is emitted from the front face opening formed in the front face. Therefore, when two terminals are provided at the two corners on the front face side, this reduces the surface area of the front face opening, so the amount of light emitted by the light emitting device ends up decreasing.

Also, with the method in Japanese Laid-Open Patent Application Publication No. 2010-62272, when the molded article that constitutes the outside of the light emitting device is made from a resin, there is the risk that the strength of the molded article will be decreased when flux penetrates into the resin constituting the molded article during the soldering of the four terminals to the mounting board. This decrease in the strength of the molded article has a major effect on a side view type of light emitting device, in which the molded article is already low in strength around the front face where the front face opening is formed.

The technology disclosed herein was conceived in light of the above situation, and it is an object thereof to provide a side view type of light emitting device and a package array for a light emitting device with which there is less reduction in the quantity of light and less decrease in strength.

The light emitting device disclosed herein comprises a substantially cuboid package and a light emitting element that is installed in the package. The package is constituted by a molded article and first and second leads that are each embedded in the molded article. The first lead has a first terminal component that is exposed from the molded article at a boundary between a first side face, a bottom face, and a rear face that is opposite a light emission face contiguous with the bottom face of the package. The second lead has a second terminal component that is exposed from the molded article at a boundary between a second side face opposite to the first side face, the bottom face, and the rear face. The first terminal component has a first terminal concavity which opens on the first side face, the bottom face, and the rear face. The second terminal component has a second terminal concavity which opens on the second side face, the bottom face, and the rear face.

The technology disclosed herein provides a side view type of light emitting device and a package array for a light emitting device with which there is less reduction in the quantity of light and less decrease in strength.

DETAILED DESCRIPTION OF EMBODIMENTS

Embodiments of the present invention will now be described through reference to the drawings. In the discussion of the drawings below, portions that are the same or similar will be given the same or similar numbers. The drawings, however, are merely representations, and the proportions of the various dimensions may vary from those in actuality. Therefore, specific dimensions and so forth should be decided on by referring to the following description. Also, the dimensional relations and proportions of some portions may, of course, vary from one drawing to the next.

First Embodiment

Summary of First Embodiment

In the first embodiment, a side view type of light emitting device is described with which there is less reduction in the quantity of light and less decrease in strength. More specifically, the light emitting device has two terminals that are exposed at two corners formed by the rear face, the bottom face, and two side faces, and does not have any terminals that are exposed on the front face or top face. A concavity capable of holding solder is formed in each of the two terminals.

The configuration of the light emitting device, mounting board, and circuit board, and the method for manufacturing the light emitting device, will now be described in order.

Configuration of Light Emitting Device

Figure 1:
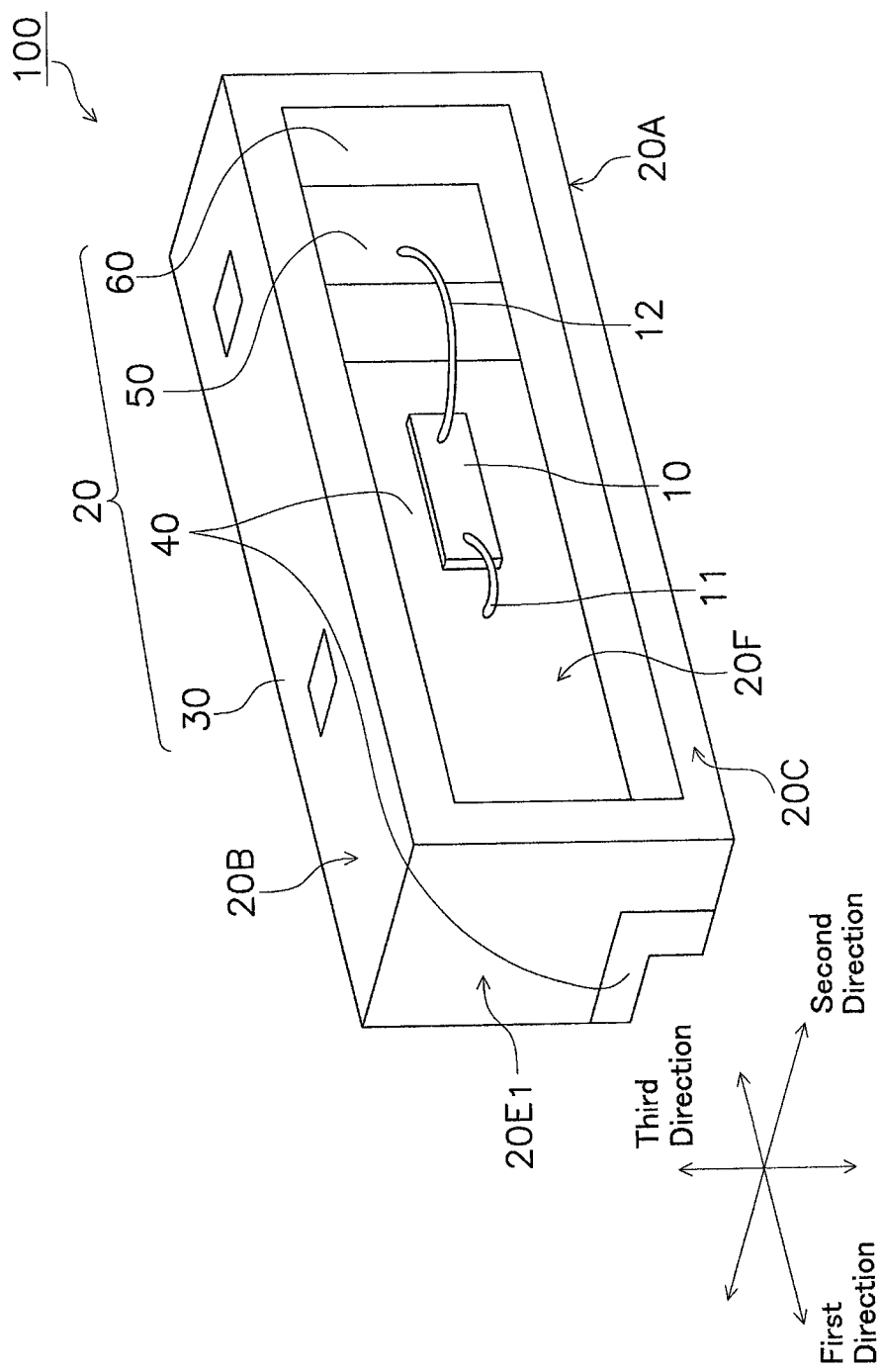
FIG. 1 is an oblique view of a light emitting device 100 pertaining to a first embodiment, as seen from the front.
Figure 2:
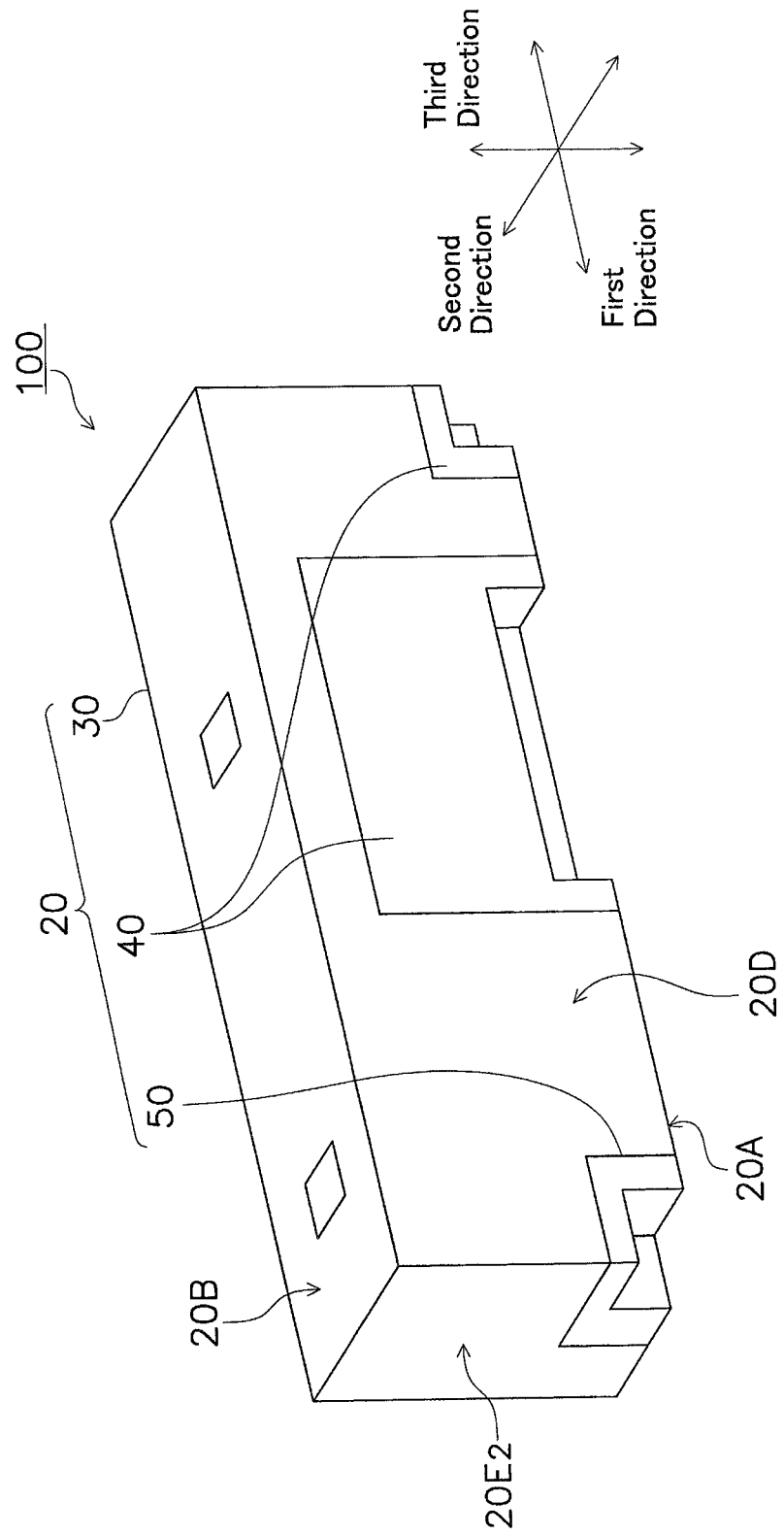
FIG. 2 is an oblique view of the light emitting device 100 pertaining to the first embodiment, as seen from the rear.

The configuration of the light emitting device pertaining to the first embodiment will be described through reference to the drawings. FIG. 1 is an oblique view of a light emitting device 100 pertaining to the first embodiment, as seen from the front. FIG. 2 is an oblique view of a light emitting device 100 pertaining to the first embodiment, as seen from the rear.

The light emitting device 100 comprises a light emitting element 10 and a package 20. The light emitting device 100 pertaining to this embodiment is what is known as a side-view type of light emitting device, and light emitted from the light emitting element 10 is taken off in a direction parallel to a mounting face 200A (see FIG. 9) of a mounting board 200 (discussed below).

In this embodiment, the light emitting device 100 has a substantially cuboid shape that extends along a first direction parallel to the mounting face 200A. In this embodiment, the size of the light emitting device 100 is approximately 3 mm in the first direction, about 1 mm in a direction parallel to the mounting face 200A and perpendicular to the first direction (hereinafter referred to as the "second direction"), and about 1 mm in a direction perpendicular to the first direction and the second direction (that is, a direction perpendicular to the mounting face 200A; hereinafter referred to as the "third direction"). The size of the light emitting device 100 is not limited to this, however.

The light emitting device 100 pertaining to this embodiment is a side-view type, and the ratio of the height in the third direction to the depth in the second direction is greater than that of a top-view type. Specifically, a side-view type is taller than a top-view type. Accordingly, the light emitting device 100 pertaining to this embodiment is characterized by a tendency to topple.

Light Emitting Element 10

The light emitting element 10 is placed in the package 20. The light emitting element 10 is electrically connected to the package 20 via a first wire 11 and a second wire 12.

The light emitting element 10 is formed in a flat shape, and is disposed perpendicular to the second direction. The emitted light from the light emitting element 10 is taken off in a direction parallel to the second direction, from a front face opening 20F (discussed below).

The light emitting element 10 is a semiconductor light emitting element called a light emitting diode, for example. The light emitting element 10 preferably has as its light emitting layer a semiconductor such as GaAlN, ZnS, SnSe, SiC, GaP, GaAlAs, AlN, InN, AlInGaP, InGaN, GaN, or AlInGaN on a substrate, but is not limited to this.

A face-up structure or a face-down structure can be employed for the light emitting element 10. There are no particular restrictions on the size of the light emitting element 10, but examples include 350 μm square, 500 μm square, and 1 mm square.

Package 20

In this embodiment, the package 20 has a substantially cuboid shape that extends in the first direction. The package 20 has a bottom face 20A, a top face 20B, a front face 20C, a rear face 20D, a first side face $20E_1$, and a second side face $20E_2$.

The bottom face 20A hits the mounting face 200A (see FIG. 9) when the light emitting device 100 is mounted. The top face 20B is provided opposite the bottom face 20A. The front face 20C is a light emission face that is contiguous with the bottom face 20A and the top face 20B. The front face 20C has the front face opening 20F. The front face opening 20F guides the light emitted from the light emitting element 10 to outside the package 20. The light emitting element 10 is placed on a first connection face 41A (see FIG. 3) exposed in the interior of the front face opening 20F. The rear face 20D is contiguous with the bottom face 20A and the top face 20B, and is provided opposite the front face 20C. The rear face 20D is perpendicular to the second direction. The boundary between the rear face 20D and the bottom face 20A is parallel to the first direction. The first side face $20E_1$ is contiguous with the rear face 20D and the front face 20C. The second side face $20E_2$ is provided opposite the first side face $20E_1$. The first side face $20E_1$ and the second side face $20E_2$ are perpendicular to the first direction.

The package 20 is made up of a molded article 30, a first lead 40, a second lead 50, and a sealing resin 60.

(1) Molded Article 30

The molded article 30 forms the outer shape of the package 20. The molded article 30 is heat resistant and has the required strength, and is made of an electrically insulating material that does not readily transmit outside light, the light emitted from the light emitting element 10, or other such light. A favorable example of this material is a triazine derivative epoxy resin, which is a thermosetting resin. This thermosetting resin may contain an acid anhydride, an antioxidant, a parting agent, a light reflecting member, an inorganic filler, a curing catalyst, a light stabilizer, and a lubricant. Titanium dioxide, added in an amount of 0 to 90 wt %, and preferably 10 to 60 wt %, can be used as the light reflecting member. The material of the molded article 30 is not limited to this, however, and can be, for example, one or more types of thermosetting resin selected from among epoxy resins, modified epoxy resins, silicone resins, modified silicone resins, acrylate resins, and urethane resins. Epoxy resins, modified epoxy resins, silicone resins, and modified silicone resins are particularly favorable as the material for the molded article 30. A thermoplastic resin may also be used, such as a liquid crystal polymer, a polyphthalamide resin, or polybutylene terephthalate (PBT).

(2) First Lead 40 and Second Lead 50

The first lead 40 and the second lead 50 are preferably made of a material having a relatively high thermal conductivity (such as at least about 200 W/(m·K)). This allows any heat generated from the light emitting element 10 to be efficiently transmitted. Examples of such a material include one or more layers of nickel, gold, copper, silver, molybdenum, tungsten, aluminum, iron, or another such metal, or of an iron-nickel alloy, phosphor bronze, ferrous copper, or another such alloy. The surfaces of the first lead 40 and the second lead 50 may also be plated.

The majority of the first lead 40 and the second lead 50 is embedded in the molded article 30, and just parts of the first lead 40 and the second lead 50 are exposed from the molded article 30. Specifically, just parts of the first lead 40 and the second lead 50 can be seen from the outside of the package 20. In particular, the first lead 40 and the second lead 50 each have one external electrode that can be seen form the outside of the package 20 (a first terminal part 42 and a second terminal part 52 (see FIG. 4); discussed below). In this embodiment, no external electrodes other than these two can be seen from the outside of the package 20. The configuration of the first lead 40 and the second lead 50 will be discussed below.

(3) Sealing Resin 60

The sealing resin 60 is packed into the interior of the front face opening 20F, and seals the light emitting element 10. This sealing resin 60 can be a translucent resin, such as one or more types of resin selected from among polyolefin resins, polycarbonate resins, polystyrene resins, epoxy resins, acrylic resins, acrylate resins, methacrylic resins (PMMA, etc.), urethane resins, polyimide resins, polynorbornene resins, fluororesins, silicone resins, modified silicone resins, and modified epoxy resins. This material may also contain a diffusion agent, filler, pigment, fluorescent substance, etc., as discussed in Japanese Laid-Open Patent Application 2006-229055 and WO2006/038502.

Lead Configuration

Figure 3:
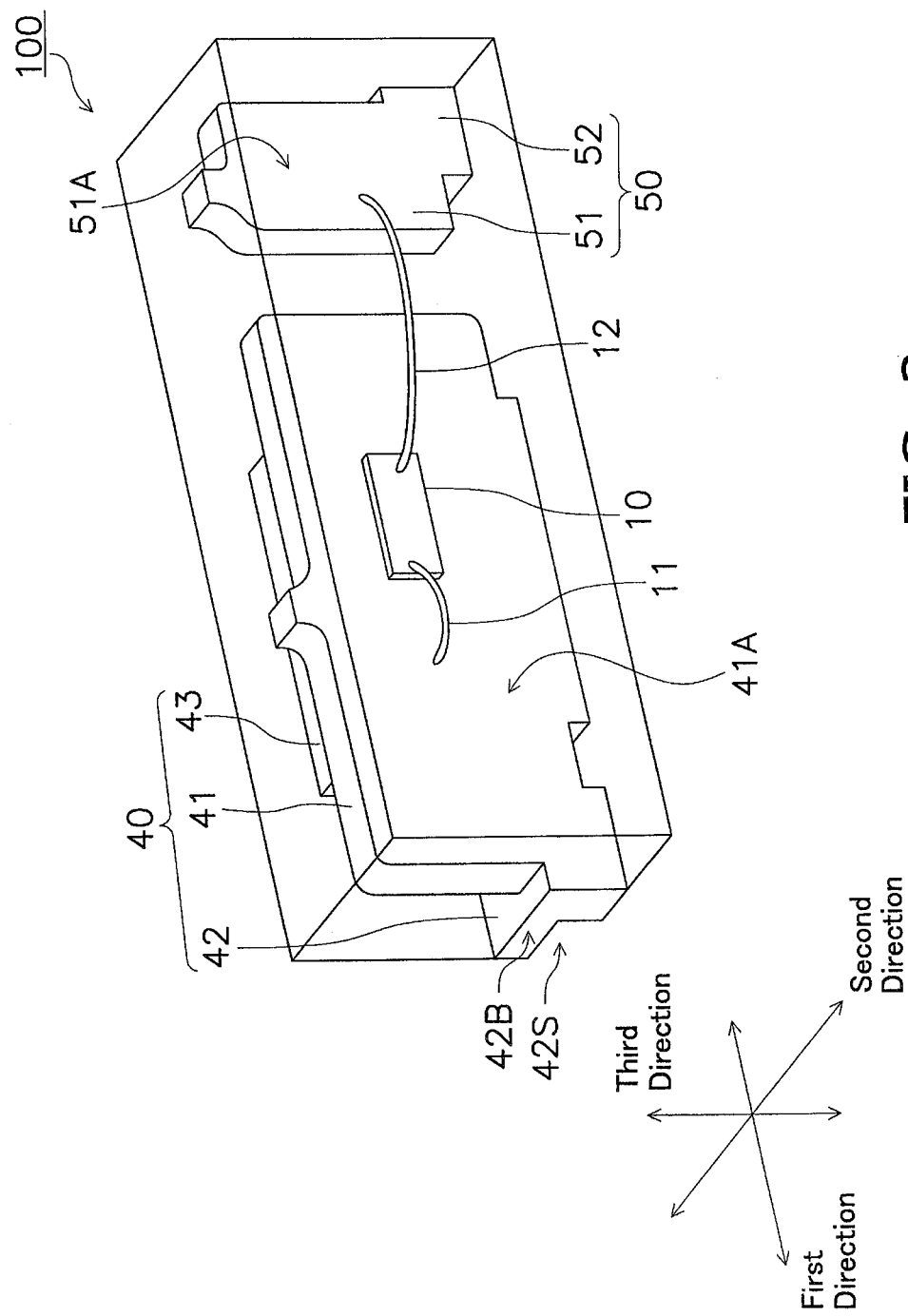
FIG. 3 is a see-through view of FIG. 1.
Figure 4:
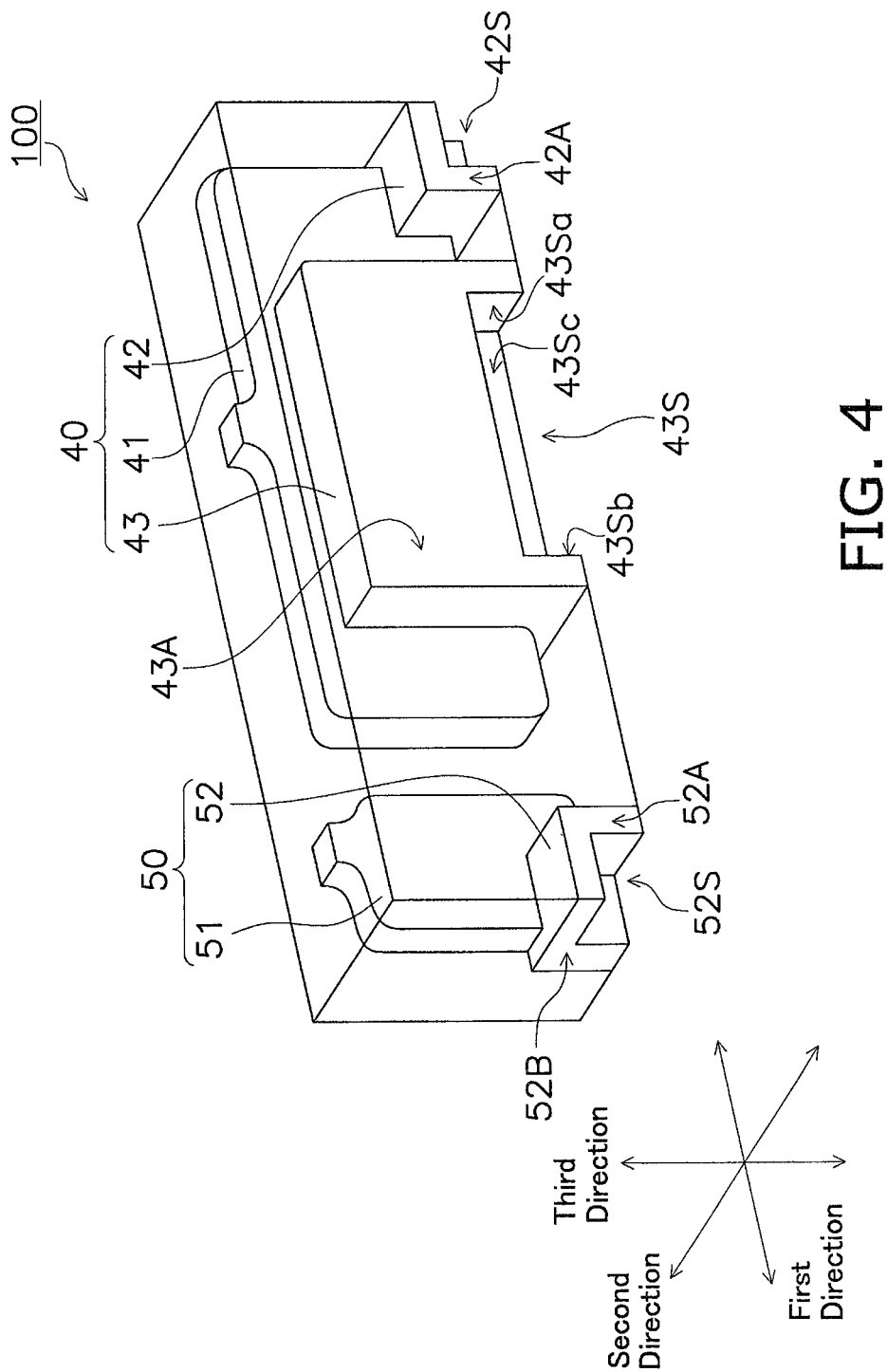
FIG. 4 is a see-through view of FIG. 2.
Figure 5:
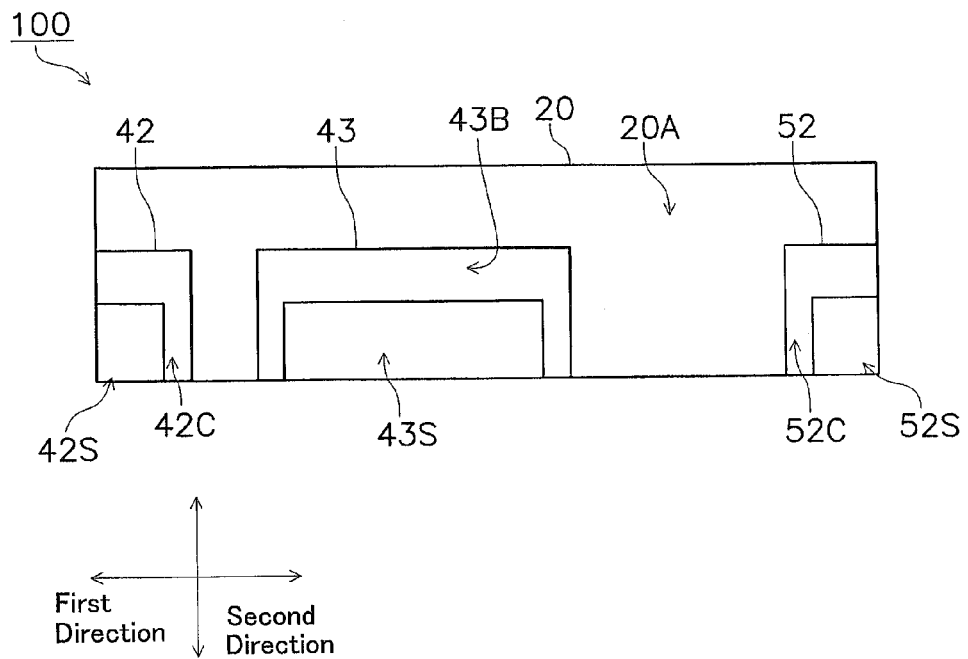
FIG. 5 is a plan view of a bottom face 20A of the light emitting device 100 pertaining to the first embodiment.

Next, the configuration of the leads pertaining to the first embodiment will be described through reference to the drawings. FIG. 3 is a see-through view of FIG. 1. FIG. 4 is a see-through view of FIG. 2. FIG. 5 is a plan view of a bottom face 20A of the light emitting device 100 pertaining to the first embodiment. In FIGS. 3 and 4, the molded article 30 is shown in outline.

Configuration of First Lead 40

The first lead 40 is made up of a first connector 41, the first terminal part 42 and a base part 43. In this embodiment, the first terminal part 42 and the base part 43 are integrally linked to the first connector 41.

(1) First Connector 41

The first connector 41 is formed in a flat shape, and is disposed along the rear face 20D. The first connector 41 has a first connection face 41A that is exposed from the molded article 30. The first connection face 41A is exposed from the molded article 30 in the interior of the front face opening 20F. The light emitting element 10 is placed in the first connection face 41A (that is, the first connection face 41A serves as the placement face where the light emitting element 10 is placed), and the first wire 11 is also connected to the first connection face 41A. This electrically connects the first connector 41 to the light emitting element 10 (that is, the first connector 41 serves as a placement face where the light emitting element 10 is placed). The first connection face 41A is sealed by the sealing resin 60 (see FIG. 1).

(2) First Terminal Part 42

The first terminal part 42 is formed in a three-dimensional shape, and is linked to the lower end of the first connector 41 on the first side face $20E_1$ side. The first terminal part 42 is exposed from the molded article 30 at the boundary between the bottom face 20A, the rear face 20D, and the first side face $20E_1$, and functions as an external electrode of the light emitting device 100. The first terminal part 42 has a first end face 42A, a second end face 42B, a third end face 42C, and a first terminal concavity 42S.

The first end face 42A is exposed from the molded article 30 at the rear face 20D of the package 20. The first end face 42A forms part of the rear face 20D. The second end face 42B is exposed from the molded article 30 at the first side face $20E_1$ of the package 20. The second end face 42B forms part of the first side face $20E_1$. The third end face 42C is exposed from the molded article 30 at the bottom face 20A of the package 20. The third end face 42C forms part of the bottom face 20A. The first terminal concavity 42S is a cut-out formed at the boundary between the bottom face 20A, the rear face 20D, and the first side face $20E_1$. The first terminal concavity 42S communicates with three faces: the bottom face 20A, the rear face 20D, and the first side face $20E_1$. When the light emitting device 100 is mounted, solder (part of a first solder fillet 301; see FIG. 10) is held in the first terminal concavity 42S.

Figure 6:
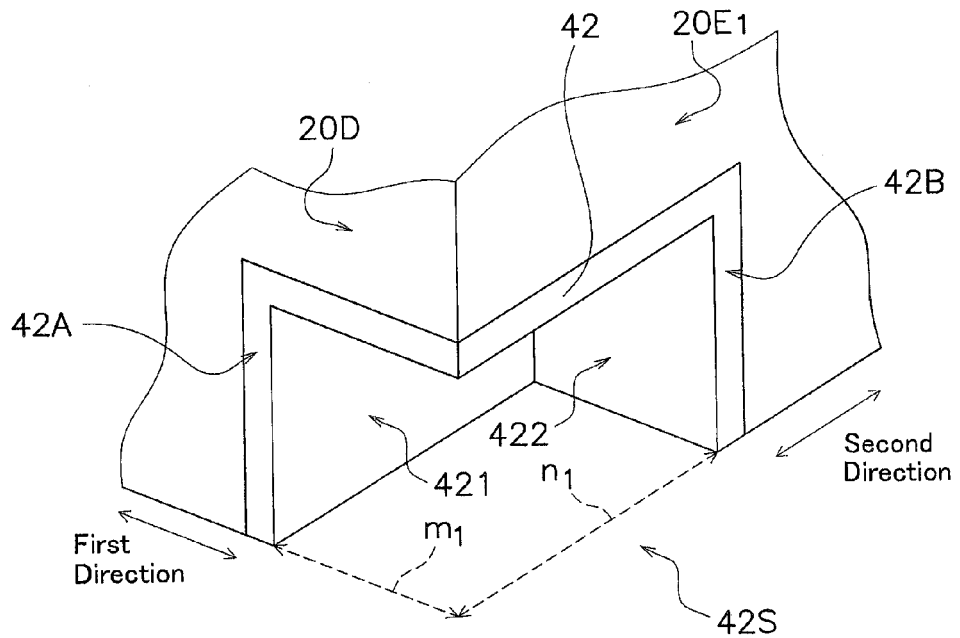
FIG. 6 is a detail oblique view of a first terminal concavity 42S pertaining to the first embodiment.

FIG. 6 is a detail oblique view of the first terminal concavity 42S pertaining to the first embodiment. As shown in FIG. 6, the depth $m_1$ of the first terminal concavity 42S in a first direction (namely, a direction perpendicular to the first side face $20E_1$) is less than the depth $n_1$ of the first terminal concavity 42S in a second direction (namely, a direction perpendicular to the rear face 20D). Therefore, solder that is held in the first terminal concavity 42S has a shape that is longer in the second direction than in the first direction.

A first inner wall 421 that is parallel to the first side face $20E_1$, and a second inner wall 422 that is parallel to the rear face 20D are formed in the interior of the first terminal concavity 42S. The first inner wall 421 and the second inner wall 422 are connected by solder held in the first terminal concavity 42S.

(3) Base Part 43

The base part 43 is lined to the bottom face 20A side of the first connector 41, that is, to the lower end of the first connector 41. The base part 43 is the base of the light emitting device 100, and functions as an "overlap" that makes the light emitting device 100, which is tall and prone to tipping, less likely to tip over.

Figure 7:
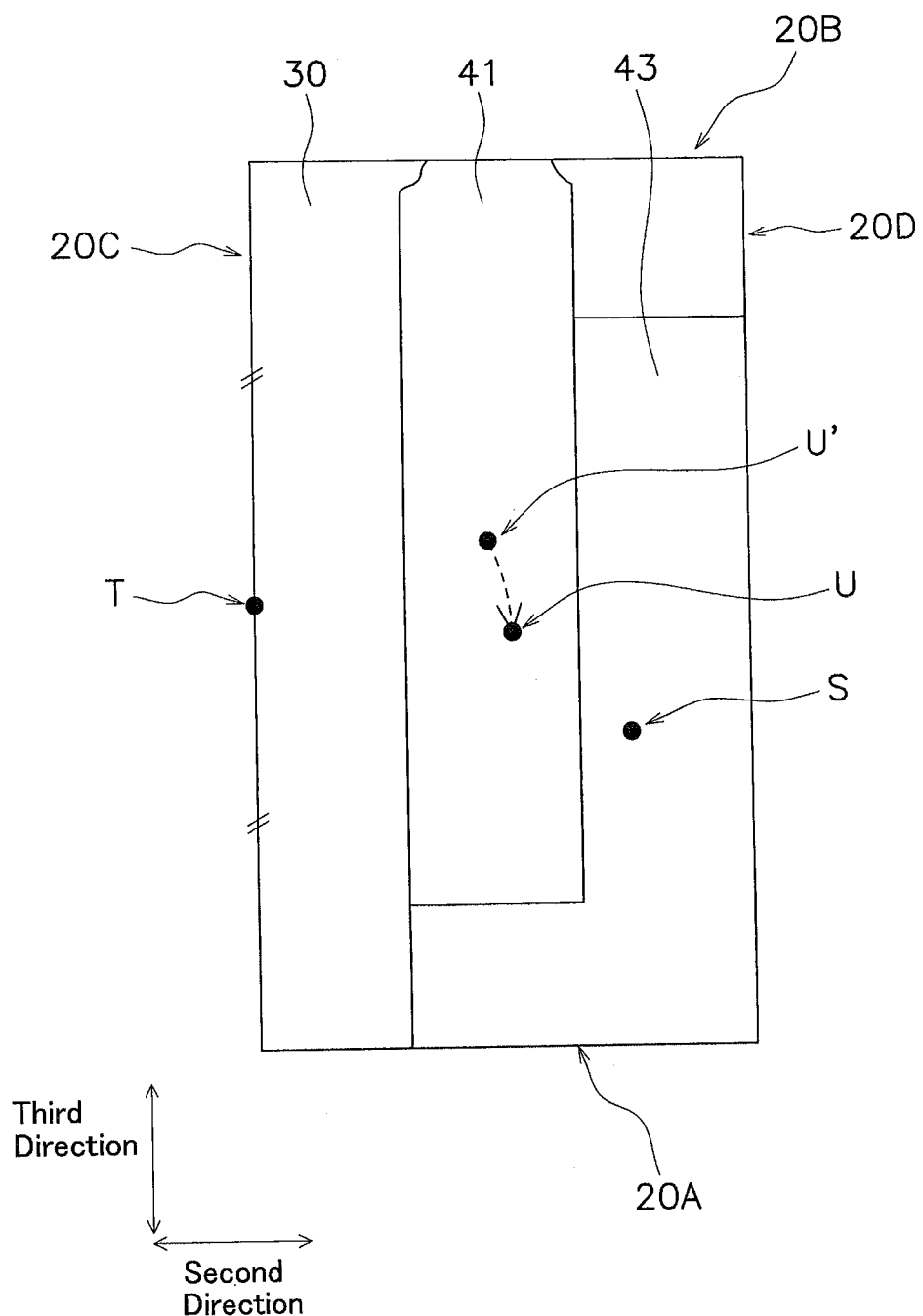
FIG. 7 is a see-through side view of the light emitting device 100 pertaining to the first embodiment.

FIG. 7 is a see-through side view of the light emitting device 100 pertaining to the first embodiment. As shown in FIG. 7, the center of gravity S of the base 43 is located more toward the bottom face 20A side than the center T of the molded article 30 in a third direction (namely, a direction perpendicular to the bottom face 20A). This gives the light emitting device 100 a low center of gravity. More specifically, as shown in FIG. 7, the center of gravity U of a light emitting device when the base 43 is present (that is, the light emitting device 100 pertaining to this embodiment) is lower than the center of gravity U' of a light emitting device when the base 43 is not present.

In this embodiment, the base part 43 also functions as a heat sink that releases heat generated from the light emitting element 10. More specifically, the base part 43 is exposed from the molded article 30 at the bottom face 20A and the rear face 20D of the package 20. As shown in FIGS. 4 and 5, the base part 43 has a first exposed face 43A that is exposed from the molded article 30 at the rear face 20D, and a second exposed face 43B that is exposed from the molded article 30 at the bottom face 20A. The first exposed face 43A forms part of the rear face 20D, and the second exposed face 43B forms part of the bottom face 20A. When the light emitting device 100 is mounted, the first exposed face 43A is exposed on the outside of the light emitting device 100, and the second exposed face 43B is in contact with the mounting face 200A (see FIG. 10).

The surface area of the first exposed face 43A is greater than the surface area of the second exposed face 43B. That is, the surface area of the base 43 that is exposed at the rear face 20D is greater than the surface area of the base 43 that is exposed at the bottom face 20A. As a result, the lead 40 pertaining to this embodiment is exposed in a larger surface area on the rear face 20D than on the bottom face 20A.

Also, in this embodiment, the base part 43 has a concavity 43S that communicates with the bottom face 20A and the rear face 20D. The concavity 43S is a cut-out formed in part of the boundary between the bottom face 20A and the rear face 20D. As shown in FIG. 4, the concavity 43S has a first inner wall 43Sa, a second inner wall 43Sb, and a third inner wall 43Sc. The first inner wall 43Sa is perpendicular to the first direction. The second inner wall 43Sb is opposite the first inner wall 43Sa. The third inner wall 43Sc is perpendicular to the second direction and is contiguous with the first inner wall 43Sa and the second inner wall 43Sb. When the light emitting device 100 is mounted, a third solder fillet 303a is formed over the first inner wall 43Sa, and a third solder fillet 303b is formed over the second inner wall 43Sb (see FIG. 10). Meanwhile, when the light emitting device 100 is mounted, the third inner wall 43Sc is exposed on the outside of the light emitting device 100.

Configuration of Second Lead 50

The second lead 50 is made up of a second connector 51 and the second terminal part 52. In this embodiment, the second connector 51 and the second terminal part 52 are formed integrally.

(1) Second Connector 51

The second connector 51 is formed in a flat shape, and is disposed along the rear face 20D. The first to third side faces $20D_1$ to $20D_3$ of the second connector 51 are covered by the molded article 30. Meanwhile, the second connector 51 has a second connection face 51A that is exposed from the molded article 30.

The second connection face 51A is exposed from the molded article 30 in the interior of the front face opening 20F. The second wire 12 is connected to the second connection face 51A. This electrically connects the second connector 51 and the light emitting element 10. The second connection face 51A is sealed by the sealing resin 60 (see FIG. 1).

(2) Second Terminal Part 52

The second terminal part 52 is formed in a three-dimensional shape, and is linked to the lower end of the second connector 51 on the second side face $20E_2$ side. Part of the second terminal part 52 is exposed from the molded article 30 at the boundary between the bottom face 20A, the rear face 20D, and the second side face $20E_2$, and functions as an external electrode of the light emitting device 100. The second terminal part 52 has a first end face 52A, a second end face 52B, a third end face 52C, and a second terminal concavity 52S.

The first end face 52A is exposed from the molded article 30 at the rear face 20D of the package 20. The first end face 52A forms part of the rear face 20D. The second end face 52B is exposed from the molded article 30 at the second side face $20E_2$ of the package 20. The second end face 52B forms part of the second side face 20E₂. The third end face 52C is exposed from the molded article 30 at the bottom face 20A of the package 20. The third end face 52C forms part of the bottom face 20A. The second terminal concavity 52S is a cut-out formed at the boundary between the bottom face 20A, the rear face 20D, and the second side face 20E₂. The second terminal concavity 52S communicates with three faces: the bottom face 20A, the rear face 20D, and the second side face 20E₂. When the light emitting device 100 is mounted, solder (part of a second solder fillet; see FIG. 10) is held in the second terminal concavity 52S.

Figure 8:
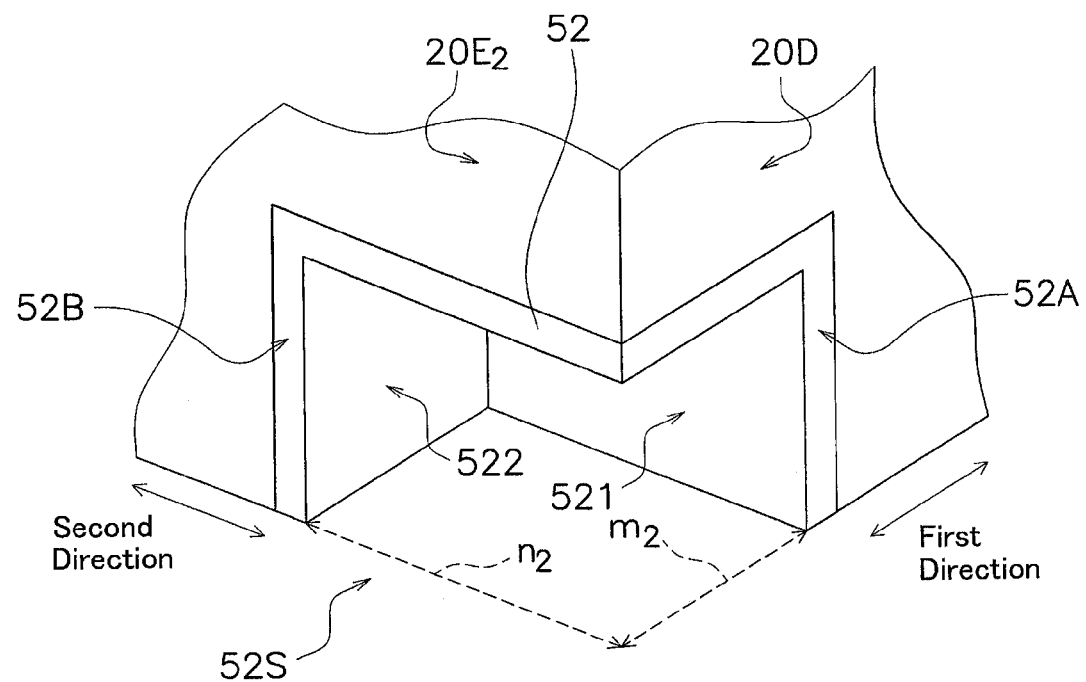
FIG. 8 is a detail oblique view of a second terminal concavity 52S pertaining to the first embodiment.

FIG. 8 is a detail oblique view of the second terminal concavity 52S pertaining to the first embodiment. As shown in FIG. 8, the depth $m_2$ of the second terminal concavity 52S in a first direction (namely, a direction perpendicular to the second side face 20E₂) is less than the depth $n_2$ of the second terminal concavity 52S in a second direction (namely, a direction perpendicular to the rear face 20D). Therefore, solder that is held in the second terminal concavity 52S has a shape that is longer in the second direction than in the first direction.

A second inner wall 521 that is parallel to the second side face 20E₂, and a second inner wall 522 that is parallel to the rear face 20D are formed in the interior of the second terminal concavity 52S. The first inner wall 521 and the second inner wall 522 are connected by solder held in the second terminal concavity 52S.

Configuration of Mounting Board

Figure 9:
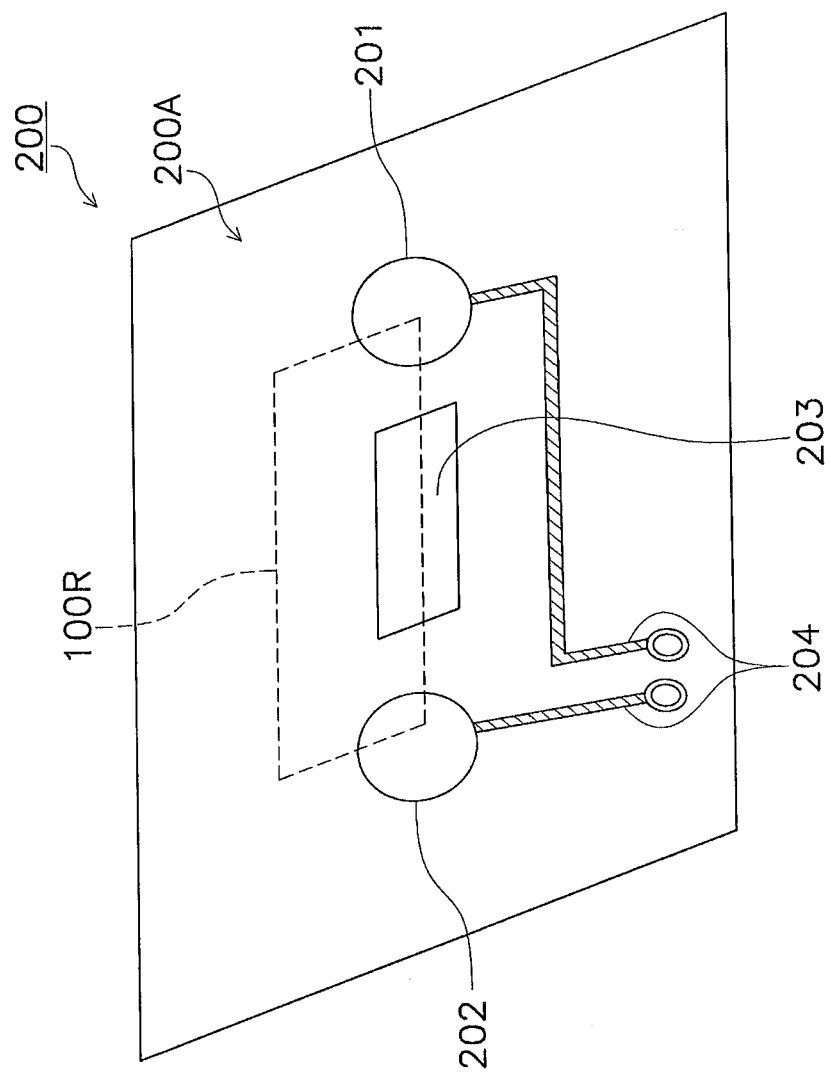
FIG. 9 is an oblique view of the mounting face of a mounting board 200 pertaining to the first embodiment.

Next, the configuration of the mounting board pertaining to the first embodiment will be described though reference to the drawings. FIG. 9 is an oblique view of the mounting face of a mounting board 200 pertaining to the first embodiment. In FIG. 9, the region where the light emitting device 100 is mounted is shown as a mounting region 100R.

As shown in FIG. 9, the mounting board 200 has the mounting face mounting face 200A, a first land 201, a second land 202, a third land 203, and an electrical circuit 204.

The light emitting device 100 is mounted on the mounting face 200A. The first land 201 is a metal member for connecting the first terminal part 42. The second land 202 is a metal member for connecting the second terminal part 52. The third land 203 is a metal member for connecting the base part 43. Copper foil or the like can be used, for example, as the first to third lands 201 to 203. The surfaces of the first to third lands 201 to 203 form part of the mounting face 200A.

The electrical circuit 204 is connected to the first land 201 and the second land 202. Consequently, the first land 201 functions as an external terminal corresponding to the first terminal part 42, and the second land 202 functions as an external terminal corresponding to the second terminal part 52. Meanwhile, the electrical circuit 204 is not connected to the third land 203, and is in fact electrically isolated from the third land 203. Accordingly, the third land 203 does not function as an external terminal, and is a member that is just for providing the third solder fillets 303 (discussed below).

Configuration of Circuit Board

Figure 10:
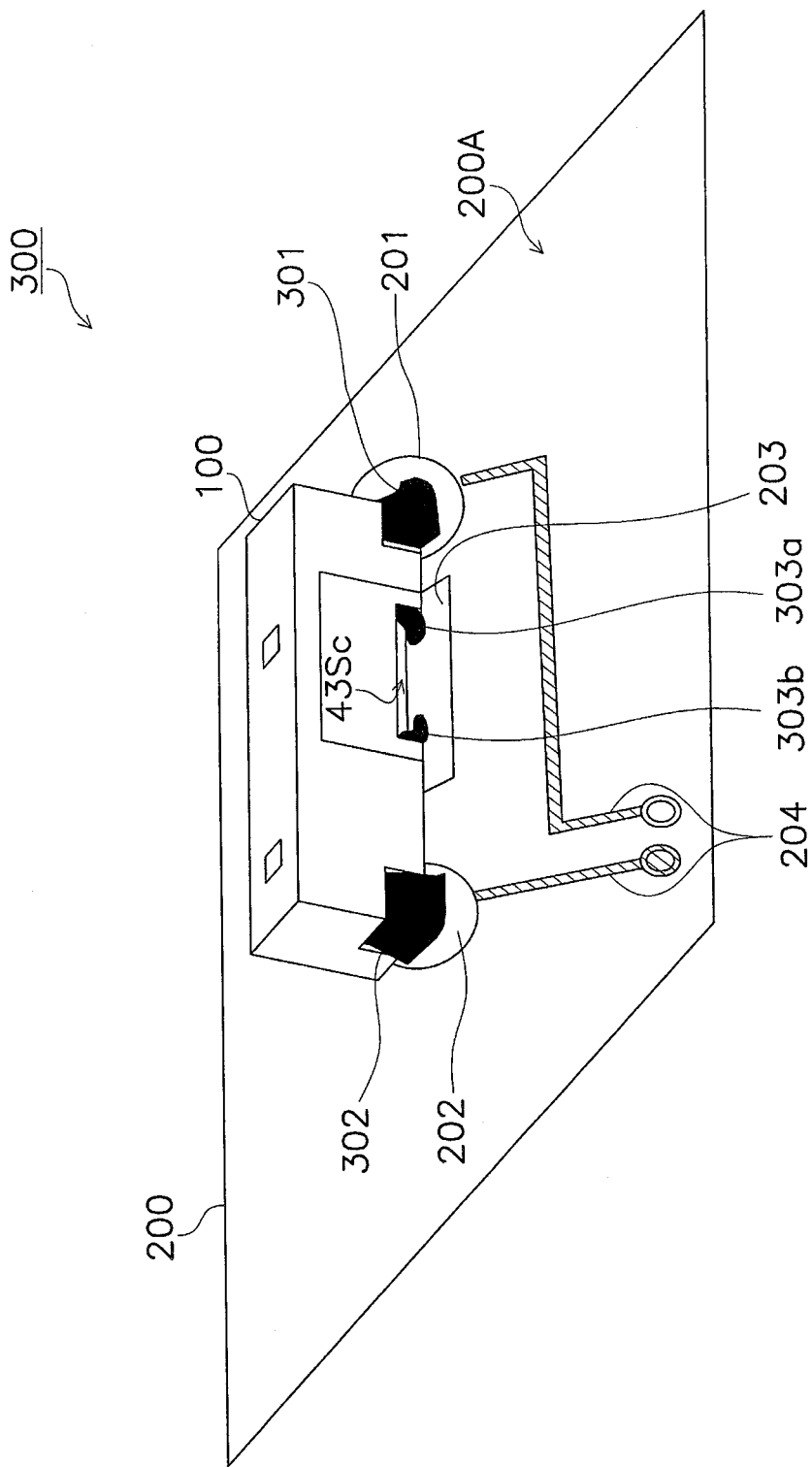
FIG. 10 is an oblique view of the mounting face of a circuit board 300 pertaining to the first embodiment.

Next, the configuration of the circuit board pertaining to the first embodiment will be described through reference to the drawings. FIG. 10 is an oblique view of the mounting face of a circuit board 300 pertaining to the first embodiment.

As shown in FIG. 10, the circuit board 300 comprises the light emitting device 100, the mounting board 200, the first solder fillet 301, a second solder fillet 302, and the pair of third solder fillets 303a and 303b. The first to third solder fillets 301 to 303b are formed by reflow soldering using a solder material that contains a flux.

The first solder fillet 301 is formed spanning from the mounting face 200A to the rear face 20D and the first side face 20E₁. The first solder fillet 301 is held in the interior of the first terminal concavity 42S. Consequently, the first terminal part 42 and the first land 201 are electrically and mechanically connected.

The second solder fillet 302 is formed spanning from above the mounting face 200A to the rear face 20D and the second side face 20E₂. The second solder fillet 302 is packed in the interior of the second terminal concavity 52S. Consequently, the second terminal part 52 and the second land 202 are electrically, mechanically, and thermally connected.

The pair of third solder fillets 303a and 303b are disposed in the interior of the concavity 43S. More specifically, the third solder fillet 303a is formed spanning from the mounting face 200A to the first inner wall 43Sa, and the third solder fillet 303b is formed spanning from the mounting face 200A to the second inner wall 43Sb. The third solder fillet 303a and the third solder fillet 303b are opposite one another. The third solder fillet 303a and the third solder fillet 303b mechanically and thermally connect the base part 43 and the third land 203. The third inner wall 43Sc, meanwhile, is exposed on the outside of the light emitting device 100.

Method for Manufacturing Light Emitting Devices

Figure 12:
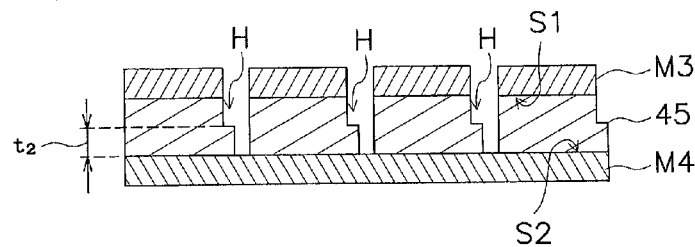
FIG. 12 is a diagram illustrating a method for manufacturing the light emitting device 100 pertaining to the first embodiment.
Figure 12:
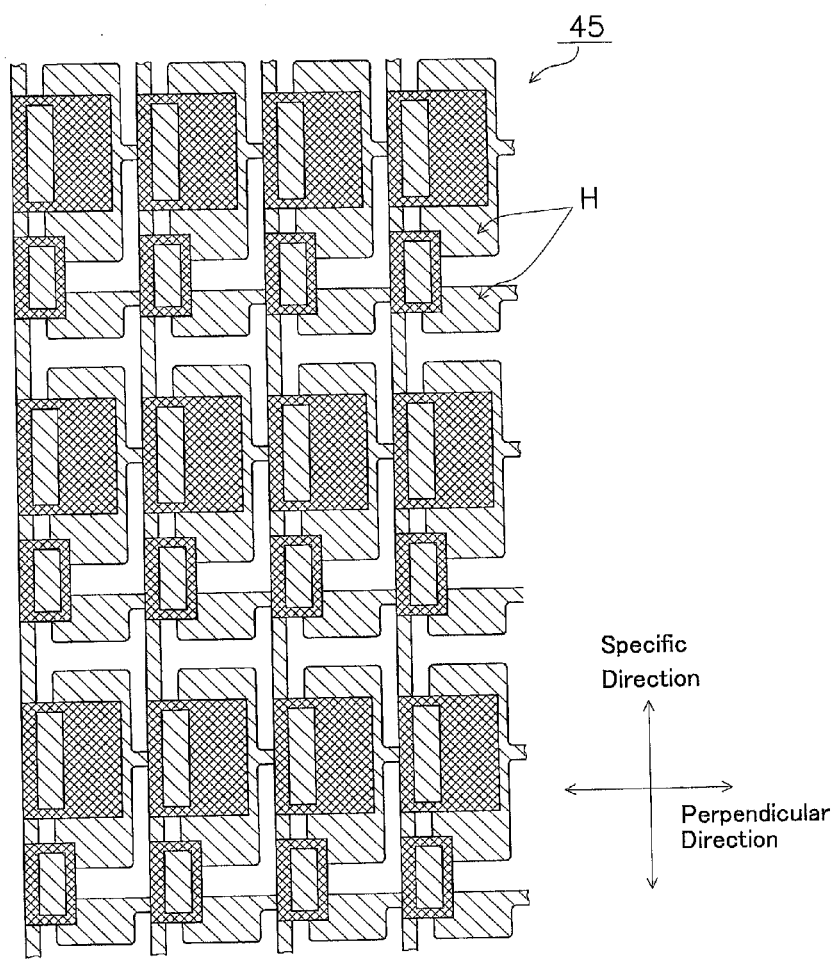
Figure 13:
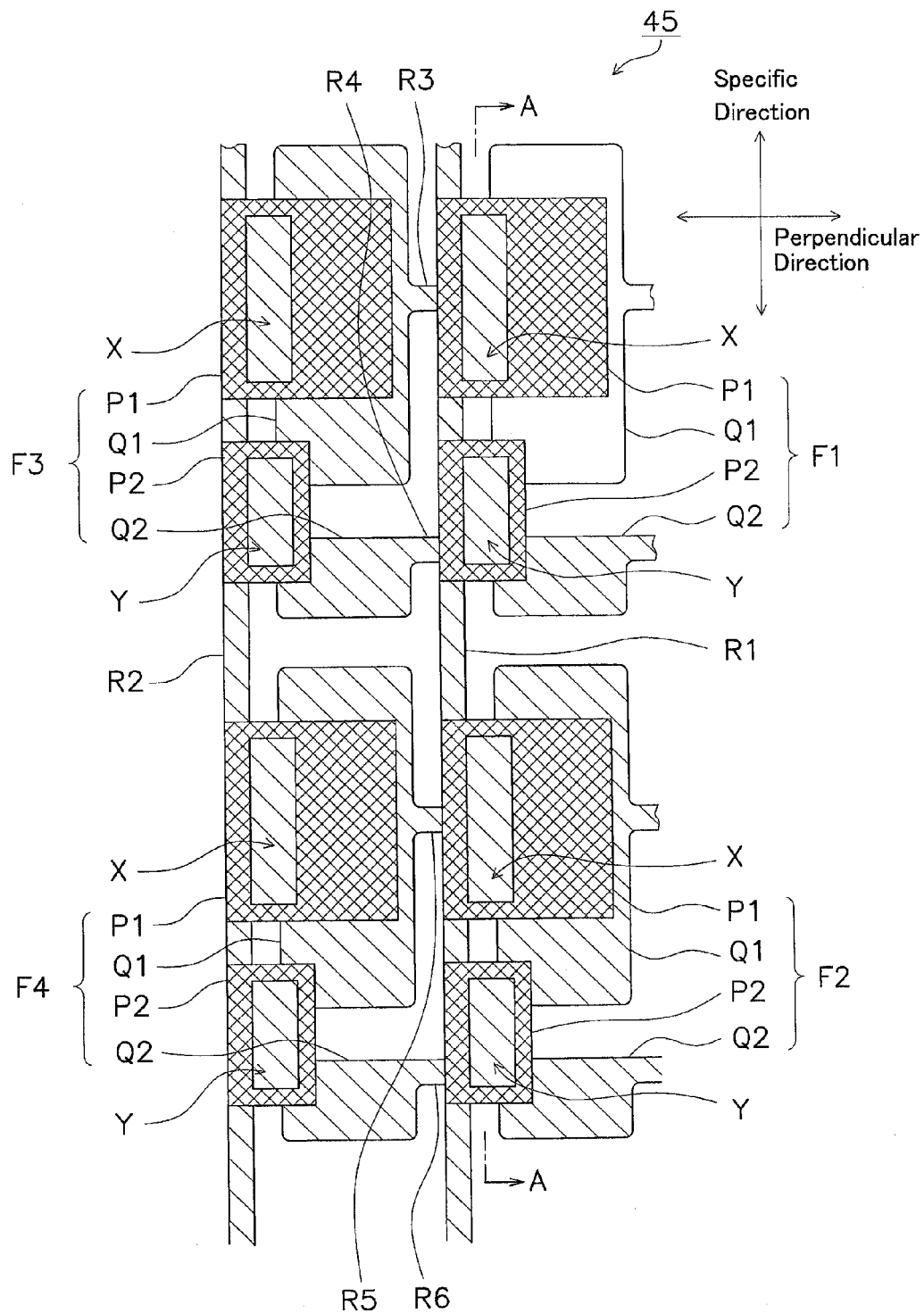
FIG. 13 is a detail view of a lead frame 45 pertaining to the first embodiment.
Figure 14:
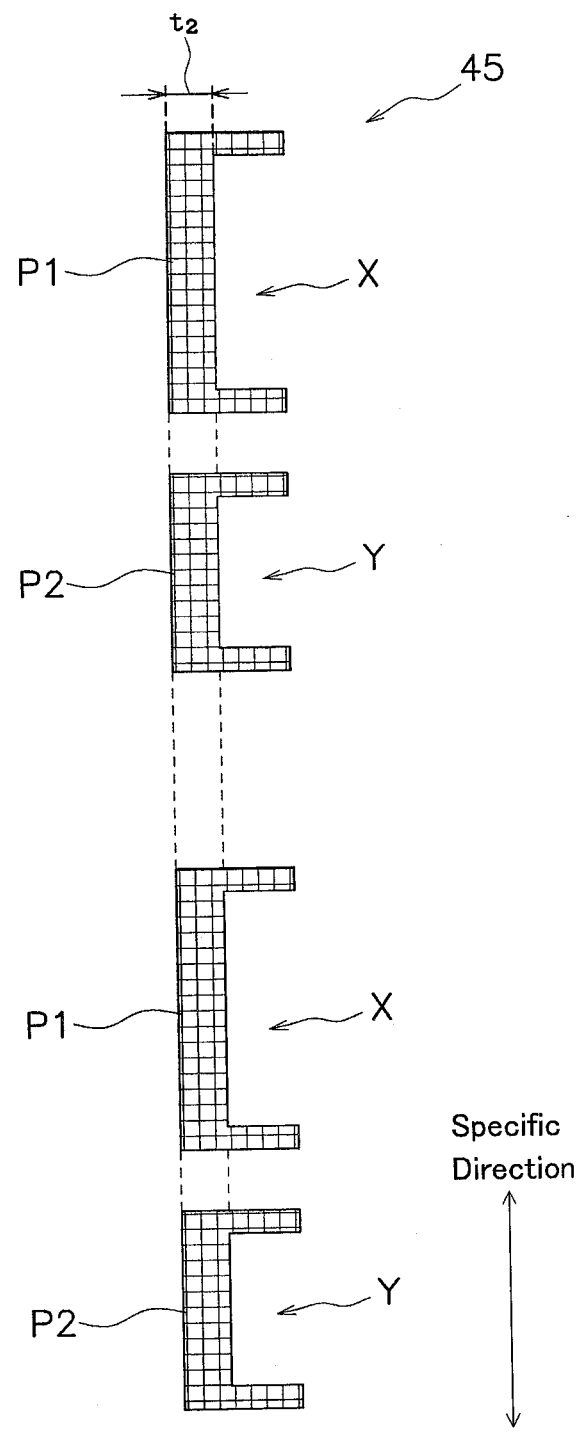
FIG. 14 is a cross section along the A-A line in FIG. 13.
Figure 15:
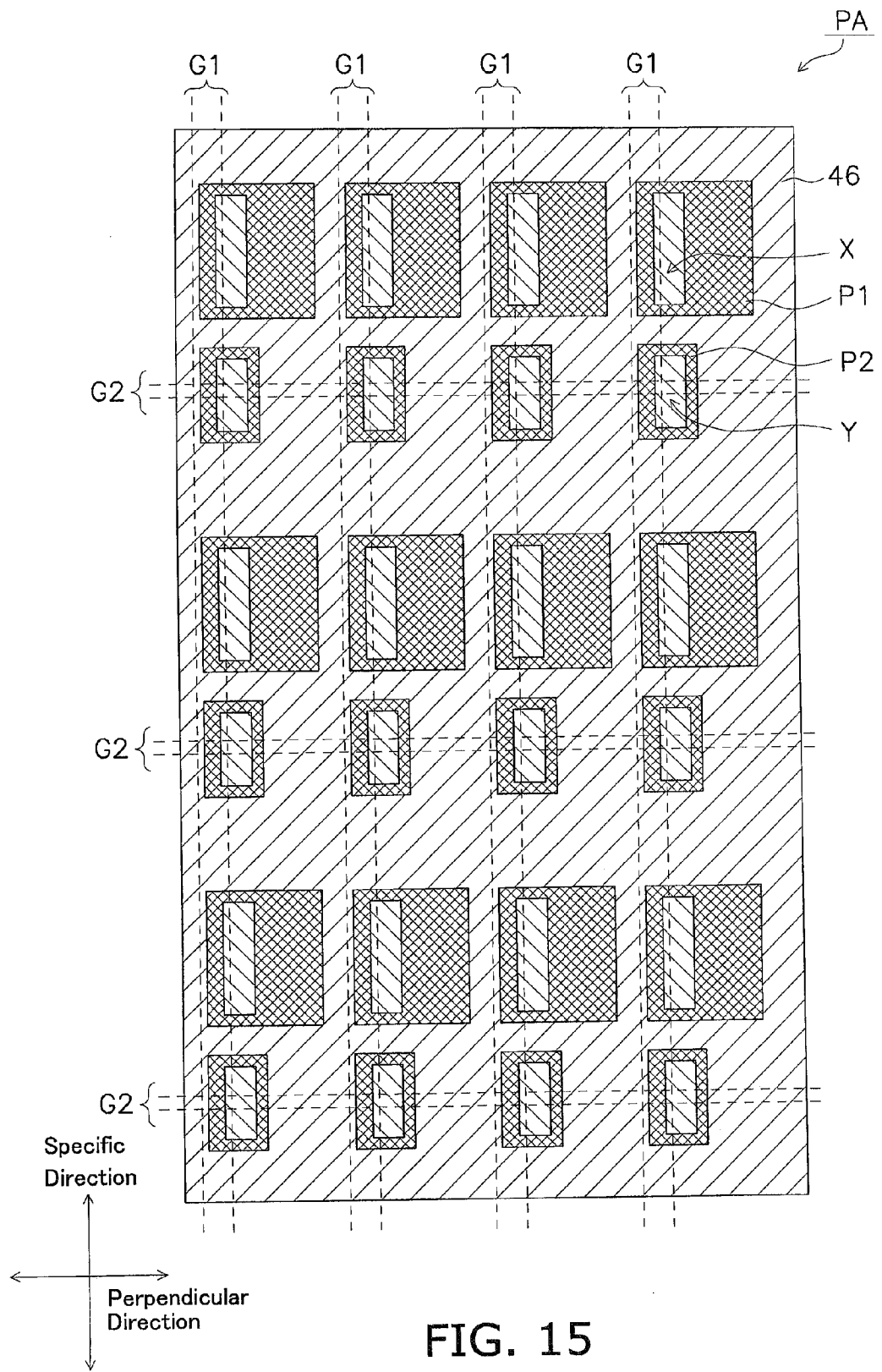
FIG. 15 is a diagram illustrating a method for manufacturing the light emitting device 100 pertaining to the first embodiment.

A method for manufacturing a plurality of the light emitting devices 100 pertaining to the first embodiment all at once will be described through reference to the drawings. FIG. 11A is a cross section of a thin metal plate 451, and FIG. 11B is a plan view of the thin metal plate 451. FIG. 12A is a cross section of a lead frame 45, and FIG. 12B is a plan view of the lead frame 45. FIG. 13 is a detail view of the lead frame 45. FIG. 14 is a cross section along the A-A line in FIG. 13. FIG. 15 is a plan view of a light emitting device package array PA pertaining to this embodiment.

First, the thin metal plate 451 is readied, which has a first main face S1 and a second main face S2 provided opposite the first main face S1. In this embodiment, the thin metal plate 451 has a thickness $t_1$ (such as about 0.5 mm).

Next, as shown in FIG. 11A, a first mask M1 is formed in a specific pattern over the first main face S1, and a second mask M2 is formed in a symmetrical pattern to the first mask M1 over the second main face S2, and the first main face S1 and the second main face S2 are etched at the same time. Consequently, as shown in FIG. 11B, etching holes G are formed in the thin metal plate 451. This etching can be accomplished by dry or wet etching. An etchant that is suitable for the material of the thin metal plate 451 should be selected.

Next, as shown in FIG. 12A, a third mask M3 is formed in a specific pattern over the first main face S1, and a fourth mask M4 is formed over the second main face S2 so as to cover the entire second main face S2, and only the first main face S1 is etched. As shown in FIG. 12B, this completes the lead frame 45, which has etching concavities H formed in the first main face S1. The depth of the etching concavities H is about 0.3 mm, for example. Accordingly, the portion of the thin metal plate 451 in which the etching concavities H are formed has a thickness $t_2$ (such as about 0.2 mm) that is less than the thickness $t_1$.

The configuration of the lead frame 45 formed in this manner will be described in detail through reference to the drawings. As shown in FIG. 13, the lead frame 45 has a first frame part F1, a second frame part F2, a third frame part F3, and a fourth frame part F4.

The first frame part F1 and the second frame part F2 are adjacent to each other in a specific direction, and are linked by a first linking frame R1. The third frame part F3 and the fourth frame part F4 are adjacent to each other in a specific direction, and are linked by a second linking frame R2. The first frame part F1 and the third frame part F3 are adjacent to each other in a perpendicular direction, which is perpendicular to a specific direction (an example of a perpendicular direction), and are linked by a third linking frame R3 and a fourth linking frame R4. The second frame part F2 and the fourth frame part F4 are adjacent to each other in a perpendicular direction, and are linked by a fifth linking frame R5 and a sixth linking frame R6.

The first to fourth frame parts F1 to F4 each have the same configuration, and include a first thick part P1, a second thick part P2, a first thin part Q1, and a second thin part Q2.

The first thick part P1 has a first thickness $t_1$ (that is, the thickness of the thin metal plate 451). In a later step, the first thick part P1 is cut with a dicing saw to form the base part 43. The second thick part P2 has the first thickness $t_1$. The second thick part P2 is isolated from the first thick part P1 in a specific direction. In a later step, the second thick part P2 is cut with a dicing saw to form the first terminal part 42 and the second terminal part 52.

The first thin part Q1 has a second thickness $t_2$ (that is, the thickness of the portion of the thin metal plate 451 where the etching concavities H are formed). The first thin part Q1 is linked to the first thick part P1 and the second thick part P2. The first thin part Q1 corresponds to an outer periphery of the mounting part 41 of the light emitting device 100. The second thin part Q2 has the second thickness $t_2$ (that is, the thickness of the portion of the thin metal plate 451 where the etching concavities H are formed). The second thin part Q2 is linked to the first thick part P1, and is isolated from the first thin part Q1 via the etching holes G in a specific direction (see FIG. 11). The second thin part Q2 corresponds to the connector 51 of the light emitting device 100.

In this embodiment, in a plan view of the lead frame 45, a one-sided etching concavity X, which is a part of the etching concavity H, is formed on the inside of the first thick part P1 of each of the frame parts F. As shown in FIG. 14, the portion of the first thick part P1 where the one-sided etching concavities X are formed has the second thickness $t_2$. In a later step, the one-sided etching concavities X are cut with a dicing saw to form the concavity 43S (see FIG. 4).

Similarly, in this embodiment, in a plan view of the lead frame 45D, a one-sided etching concavity Y, which is a part of the etching concavity H, is formed on the inside of the second thick part P2 of each of the frame parts F. As shown in FIG. 14, the portion of the second thick part P2 where the one-sided etching concavities Y are formed has the second thickness $t_2$. In a later step, the one-sided etching concavities Y are cut with a dicing saw to form the first terminal concavity 42S and the second terminal concavity 52S (see FIG. 4).

In this embodiment, the first thin part Q1 of the third frame part F3 is linked via the third linking frame R3 to the first thick part P1 of the first frame part F1. The second thin part Q2 of the third frame part F3 is linked via the fourth linking frame R4 to the second thick part P2 of the first frame part F1. Similarly, the first thin part Q1 of the fourth frame part F4 is linked via the fifth linking frame R5 to the first thick part P1 of the second frame part F2. The second thin part Q2 of the fourth frame part F4 is linked via the sixth linking frame R6 to the second thick part P2 of the second frame part F2.

The first to sixth linking frames R1 to R6 are cut with a dicing saw in a later step (see FIG. 15). That is, the first to sixth linking frames R1 to R6 are cutting allowance for dicing. The fifth and sixth linking frames R5 and R6 are cut to form the first exposed part 44 and the second exposed part 54. As shown in FIG. 13, the portion of the first thick part P1 that is linked to the third linking frame R3, and the portion of the second thick part P2 that is linked to the fourth linking frame R4 are disposed in a specific direction, and are cutting allowance for dicing as the first to sixth linking frames R1 to R6.

Next, the lead frame 45 is disposed in a metal mold. More specifically, the lead frame 45 is sandwiched between upper and lower molds.

Next, the molding material that makes up the molded article 30 is injected between the upper and lower molds.

Next, the resin material is transfer molded by being heated at a specific temperature. As shown in FIG. 15, this completes a light emitting device package array PA made up of the lead frame 45 and a molded board 46 in which the lead frame 45 is embedded. Care should be taken with the light emitting device package array PA so that the first thick part P1 and the one-sided etching concavities X, and the second thick part P2 and the one-sided etching concavities Y, are exposed from the molded board 46.

Then, as shown in FIG. 15, a dicing saw is used to cut the light emitting device package array PA along cutting lines G1 and G2 of a specific width. This allows a plurality of light emitting devices 100 to be manufactured all at once.

Action and Effect (1) With the light emitting device 100 pertaining to the first embodiment, the first lead 40 includes a first terminal component 42 that is exposed from the molded article 30 at the boundary between the bottom face 20A, the rear face 20D, and the first side face $20E_1$, and the second lead 50 has a second terminal component 52 that is exposed from the molded article 30 at the boundary between the bottom face 20A, the rear face 20D, and the second side face $20E_2$. The first lead 40 includes the first terminal concavity 42S, and the second lead 50 includes the second terminal concavity 52S. The light emitting device 100 has no external electrodes other than the first terminal component 42 and the second terminal component 52.

Thus, the first terminal component 42 and the second terminal component 52 are not exposed at the front face 20C, which is the light emission face. Therefore, a larger front face opening 20F can be formed in the front face 20C than when the first terminal component 42 and the second terminal component 52 are exposed at the front face 20C. As a result, there is less of a decrease in the quantity of light of the light emitting device 100.

This also suppresses the penetration of flux into the molded article 30 around the front face 20C. Therefore, there is less of a reduction in strength of the molded article 30 around the front face 20C, which tends to have diminished strength due to the presence of the front face opening 20F.

Also, since part of the first solder fillet 301 can be held in the first terminal concavity 42S, the contact surface area between the first terminal component 42 and the first solder fillet 301 can be increased. As a result, the light emitting device 100 can be fixed more securely to the mounting board 200. Similarly, since part of the second solder fillet 302 can be held in the second terminal concavity 52S, the contact surface area between the second terminal component 52 and the second solder fillet 302 can be increased. As a result, the light emitting device 100 can be fixed more securely to the mounting board 200.

(2) With the light emitting device 100 pertaining to the first embodiment, the depth $m_1$ of the first terminal concavity 42S in the first direction is less than the depth $n_1$ of the first terminal concavity 42S in the second direction.

Therefore, when the solder held in the first terminal concavity 42S (part of the first solder fillet 301) solidifies and shrinks, the force pulling the light emitting device 100 toward the rear face 20D side can be made smaller than the force pulling the light emitting device 100 toward the first side face $20E_1$ side. Accordingly, there will be less tendency for the front face 20C (the light emission face) to face upward, while the light emitting device 100 can be securely fixed.

Furthermore, since the light emitting device 100 is a side view type, the light emitting device 100 is readily tilted by a force pulling it toward the rear face 20D side, whereas it tends not to be tilted by a force pulling it to the first side face $20E_1$ side.

(3) With the light emitting device 100 pertaining to the first embodiment, the depth $m_2$ of the second terminal concavity 52S in a first direction is less than the depth $n_2$ of the second terminal concavity 52S in a second direction.

Therefore, when the solder held in the second terminal concavity 52S (part of the second solder fillet 302) solidifies and shrinks, the force pulling the light emitting device 100 toward the rear face 20D side can be made smaller than the force pulling the light emitting device 100 toward the second side face $20E_2$ side. Accordingly, there will be less tendency for the front face 20C (the light emission face) to face upward, while the light emitting device 100 can be securely fixed.

(4) With the light emitting device 100 pertaining to the first embodiment, the first lead 40 includes the base 43 that is linked to the lower end of the first connector 41.

Therefore, since the base 43 functions as a "weight," the light emitting device 100, which is tall and prone to tipping over, can be made less apt to tip over.

(5) With the light emitting device 100 pertaining to the first embodiment, the base 43 is exposed from the molded article 30 at the bottom face 20A of the package 20.

Therefore, heat generated by the light emitting device 100 can be released through the first connector 41 and the base 43, in that order, from the second exposed face 43B to the mounting board 200. Therefore, the heat dissipation efficiency of the light emitting device 100 can be enhanced.

(6) With the light emitting device 100 pertaining to the first embodiment, the base 43 is exposed from the molded article 30 at the rear face 20D of the package 20.

Therefore, heat generated by the light emitting device 100 can be released through the first connector 41 and the base 43, in that order, from the first exposed face 43A to the outside air.

(7) With the light emitting device 100 pertaining to the first embodiment, the center of gravity S of the base 43 is located more toward the bottom face 20A side than the center T of the molded article 30 in the third direction.

Therefore, the center of gravity of the light emitting device 100 can be reliably lowered, so the light emitting device 100 will be less prone to tipping over.

Second Embodiment

Next, a second embodiment will be described through reference to the drawings. The difference between the first and second embodiments is that a cover is provided to part of the terminal concavity. The following description will focus on this difference.

Configuration of Light Emitting Device

Figure 16:
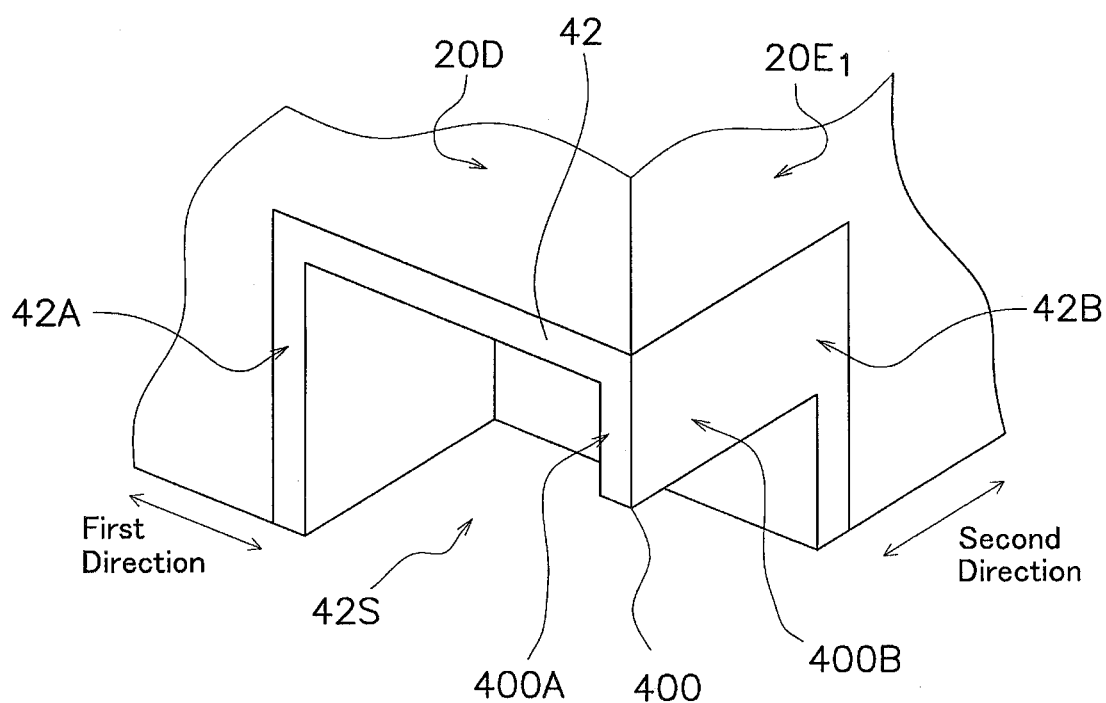
FIG. 16 is a detail oblique view of the first terminal concavity 42S pertaining to a second embodiment.

FIG. 16 is a detail oblique view of the first terminal concavity 42S pertaining to the second embodiment. As shown in FIG. 16, the first terminal component 42 has an extension 400 (an example of a first extension). The extension 400 is formed in a flat shape, and extends to the opening on the first side face $20E_1$ side of the first terminal concavity 42S. The extension 400 has a second direction end face 400A formed in the same plane as the first end face 42A, and a first direction end face 400B formed in the same plane as the second end face 42B of the first terminal component 42. In this embodiment, the extension 400 is formed integrally with the first terminal component 42.

Although not depicted, the second terminal component 52 is similar to the first terminal component 42 in that it has an extension (an example of a second extension) that extends to the opening on the second side face $20E_2$ side of the second terminal concavity 52S.

Method for Manufacturing Light Emitting Device

Figure 17:
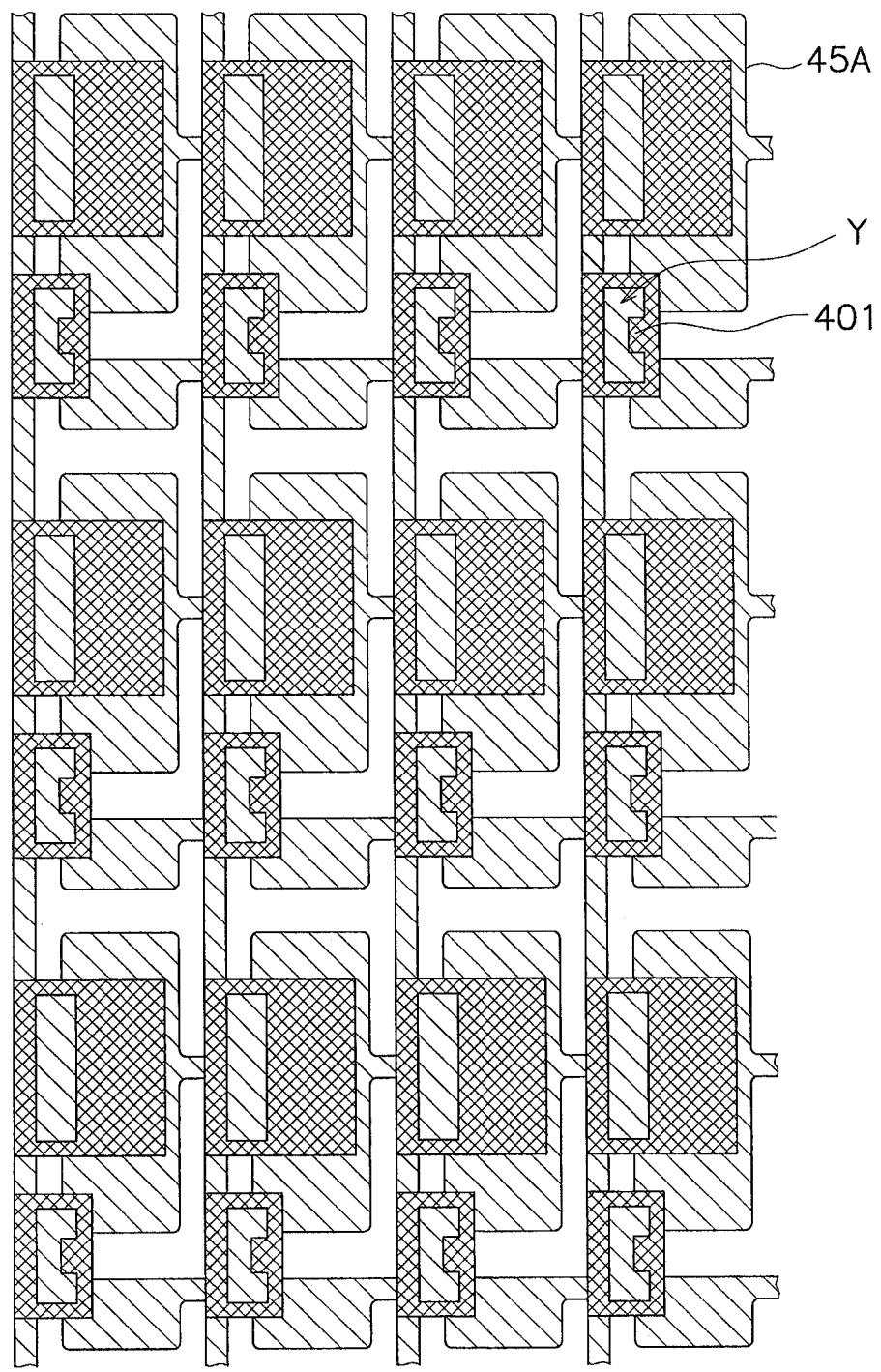
FIG. 17 is a diagram illustrating a method for manufacturing the light emitting device 100 pertaining to the second embodiment.

First, as shown in FIG. 17, a lead frame 45A having an extension base 401 is readied. This extension base 401 can be formed by setting a narrow region in which to perform one-sided etching. More specifically, it can be formed by using a C-shaped region in which to perform one-sided etching in a one-sided etching concavity Y.

Next, the lead frame 45A is embedded in a molded board 46 by transfer molding (see FIG. 15).

Next, a dicing saw is used to cut the lead frame 45A and the molded board 46 together along cutting lines of a specific width (see FIG. 15).

Action and Effect (1) The light emitting device 100 pertaining to the second embodiment is such that the first terminal component 42 has the extension 400 (an example of a "first extension"). The extension 400 extends to the opening on the first side face $20E_1$ side of the first terminal concavity 42S.

Therefore, when reflow soldering is performed to mount the light emitting device 100, the solder (part of the first solder fillet 301) can be kept from overflowing from inside the first terminal concavity 42S. Also, since the extension 400 is embedded in the solder, the contact surface area between the first terminal component 42 and the first solder fillet 301 can be increased. As a result, the light emitting device 100 can be securely fixed to the mounting board 200.

As shown in FIG. 17, this extension 400 can be formed integrally with the first terminal component 42 by using the lead frame 45A having the extension base 401 that can be formed by one-sided etching.

Modification Example of Second Embodiment

Next, a modification example of the second embodiment will be described through reference to the drawings.

Configuration of Light Emitting Device

Figure 18:
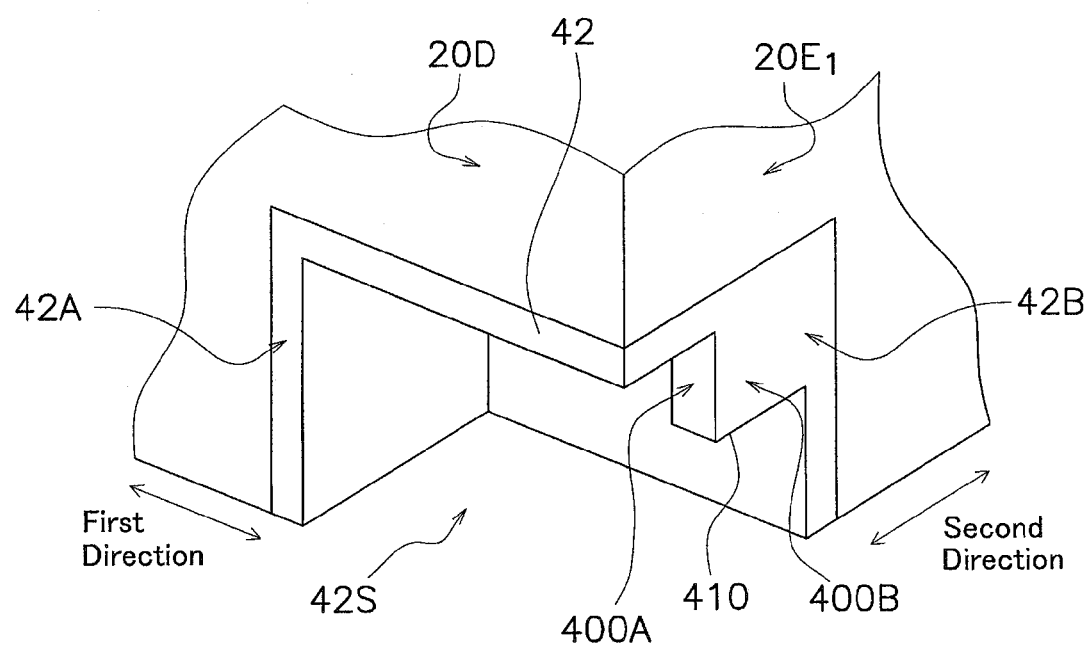
FIG. 18 is a detail oblique view of the first terminal concavity 42S pertaining to a modification example of the second embodiment.

FIG. 18 is a detail oblique view of the first terminal concavity 42S pertaining to a modification example of the second embodiment. As shown in FIG. 18, the first terminal component 42 has an extension 410 (an example of a "first extension"). The extension 410 is formed in a flat shape, and extends to the opening on the first side face $20E_1$ side of the first terminal concavity 42S.

Here, the first direction end face 400B of the extension 400 is formed in the same plane as the second end face 42B of the first terminal component 42. On the other hand, the second direction end face 400A of the extension 400 is farther to the inside than the first end face 42A of the first terminal component 42, and is not formed in the same plane as the first end face 42A.

Although not depicted, the second terminal component 52 is similar to the first terminal component 42 in that it has an extension (an example of a second extension) that extends to the opening on the second side face $20E_2$ side of the second terminal concavity 52S.

Method for Manufacturing Light Emitting Device

Figure 19:
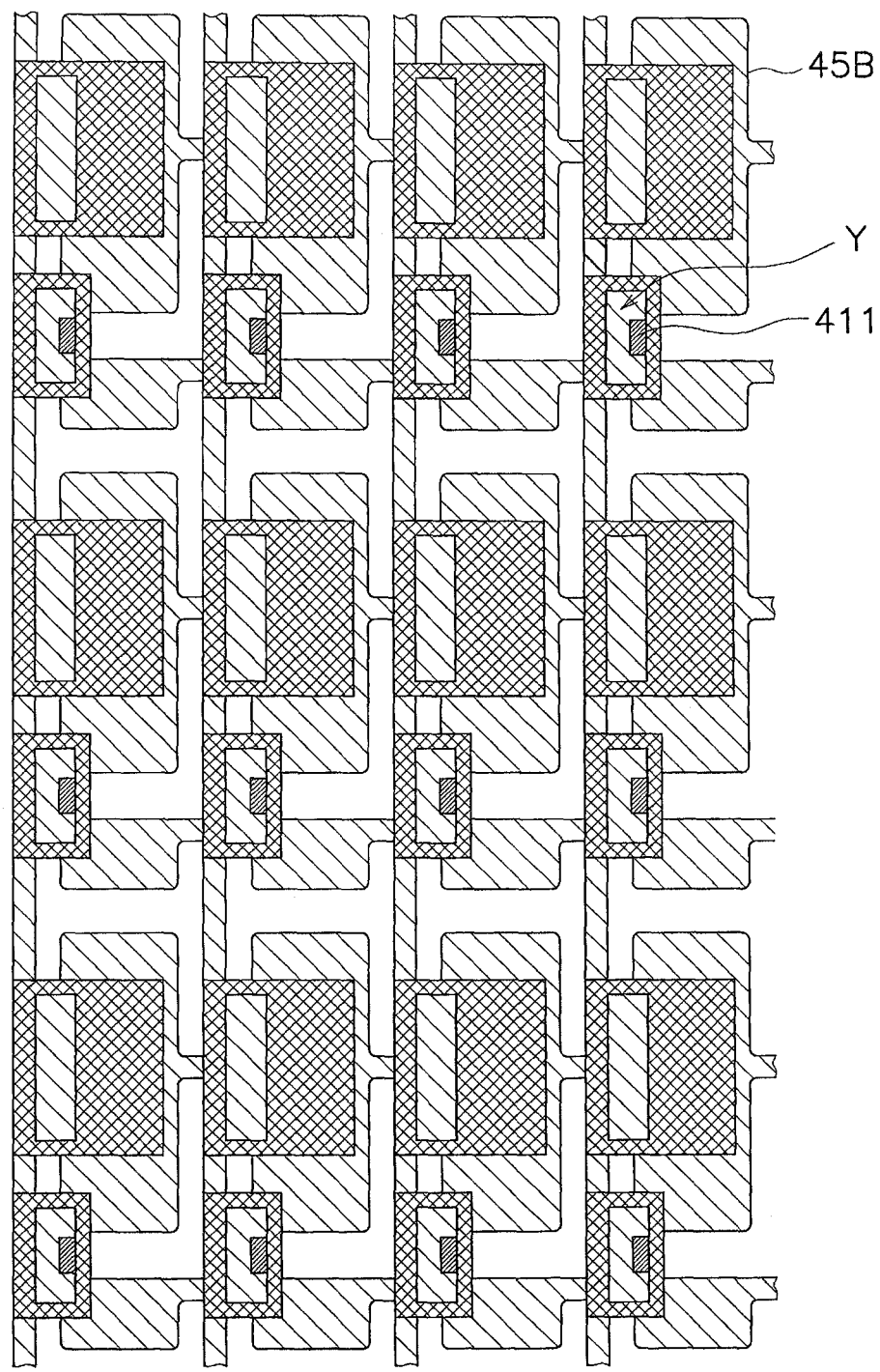
FIG. 19 is a diagram illustrating a method for manufacturing the light emitting device 100 pertaining to a modification example of the second embodiment.

First, as shown in FIG. 19, a lead frame 45B having an extension base 411 is readied. This extension base 411 can be formed integrally with the first terminal component 42 by performing one-sided etching twice. More specifically, it can be formed by first etching a flat metal member down to the depth of the extension base 411 by the first one-sided etching, and then etching down to the depth of the one-sided etching concavity Y by the second one-sided etching.

Next, the lead frame 45B is embedded in the molded board 46 by transfer molding (see FIG. 15).

Next, a dicing saw is used to cut the lead frame 45B and the molded board 46 together along cutting lines of a specific width (see FIG. 15).

Action and Effect

The extension 410 pertaining to a modification example of the second embodiment is similar to the extension 400 pertaining to the second embodiment in that the solder (part of the first solder fillet 301) can be kept from overflowing from inside the first terminal concavity 42S, and the contact surface area between the first terminal component 42 and the solder can be increased.

Third Embodiment

Next, a third embodiment will be described through reference to the drawings. The difference between the first and third embodiments is that the light emitting device 100 comprises three terminal parts. The following description will focus on this difference.

Configuration of Light Emitting Device

Figure 20:
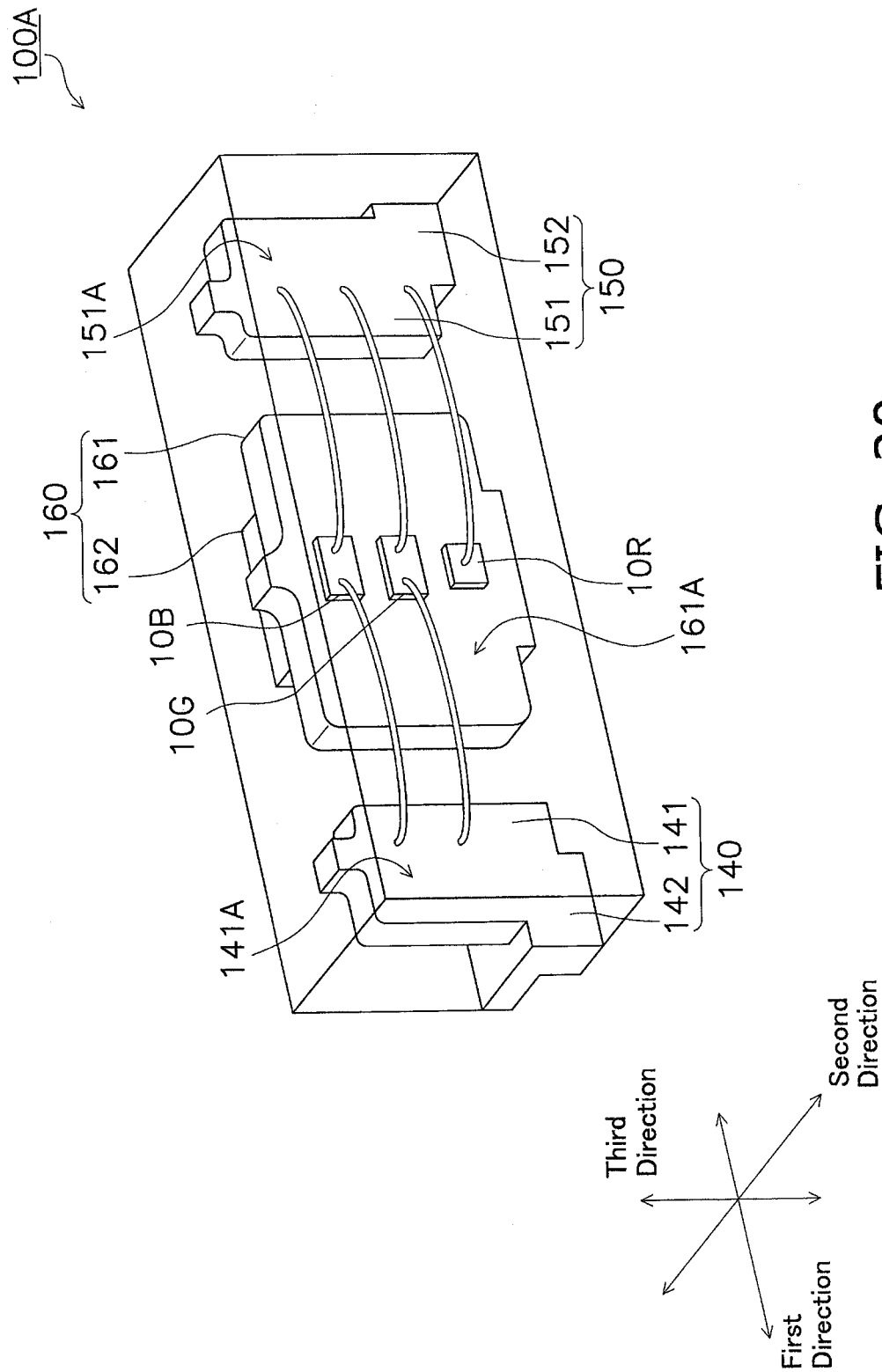
FIG. 20 is an oblique see-through view of a light emitting device 100A pertaining to a third embodiment, as seen from the front.
Figure 21:
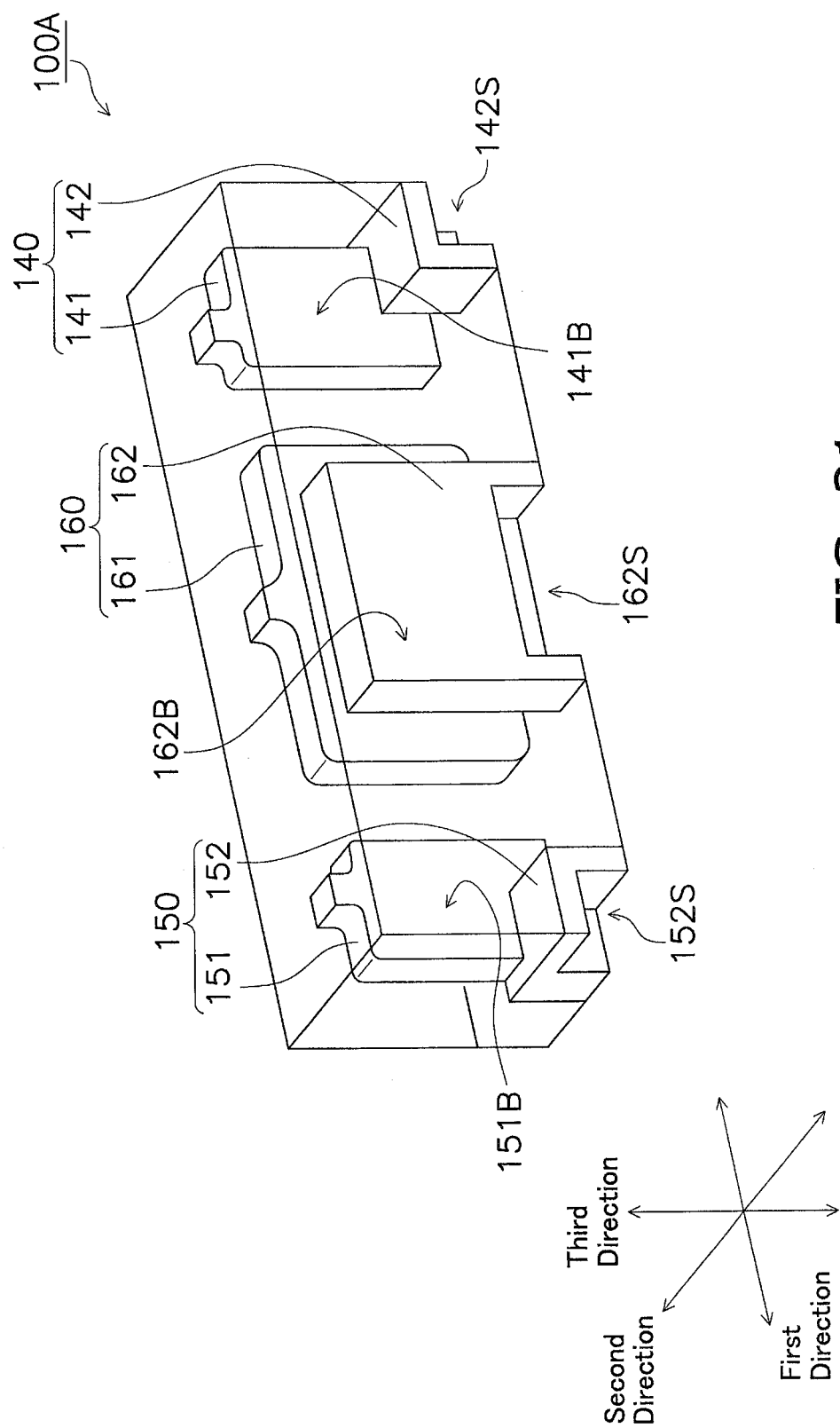
FIG. 21 is an oblique see-through view of the light emitting device 100A pertaining to the third embodiment, as seen from the rear.

FIG. 20 is an oblique see-through view of a light emitting device 100A pertaining to the third embodiment, as seen from the front. FIG. 21 is an oblique see-through view of the light emitting device 100A pertaining to the third embodiment, as seen from the rear.

As shown in FIGS. 20 and 21, the light emitting device 100A comprises a first lead 140, a second lead 150, a third lead 160, a blue light emitting element 10B, a green light emitting element 10G and a red light emitting element 10R.

The first lead 140 (an example of a "first lead") has a first connector 141 (an example of a "first connector"), a first terminal part 142 (an example of a "first terminal part"), and a first terminal concavity 142S (an example of a "first terminal concavity"). The second lead 150 (an example of a "second lead") has a second connector 151 (an example of a "second connector"), a second terminal part 152 (an example of a "second terminal part"), and a second terminal concavity 152S (an example of a "second terminal concavity"). The third lead 160 has a mounting part 161 and an exposed part 162. The first terminal part 142, the second terminal part 152, and the exposed part 162 are each electrically connected to a mounting board (not shown), and thereby function as external terminals.

The blue light emitting element 10B, the green light emitting element 10G, and the red light emitting element 10R are placed on a placement face 161A of the mounting part 161. The blue light emitting element 10B and the green light emitting element 10G are electrically connected to a first connection face 141A of the first connector 141 and a second connection face 151A of the second connector 151. The red light emitting element 1 OR is electrically connected to the second connection face 151A and the third connection face 161A.

Action and Effect

With the light emitting device 100A pertaining to the third embodiment, the first terminal component 142 and the second terminal component 152 each have a concavity that is able to hold solder and is not exposed at the front face 20C (the light emission face). Therefore, with this light emitting device 100A, there is less of a reduction in the quantity of light of the light emitting device 100A and less of a decrease in the strength of the molded article 30, and the light emitting device 100A can be securely fixed to the mounting board 200.

Fourth Embodiment

Next, a fourth embodiment will be described through reference to the drawings. The difference between the first embodiment and the fourth embodiment is that the terminal components are made taller. The following description will focus on this difference.

Configuration of Light Emitting Device

Figure 22:
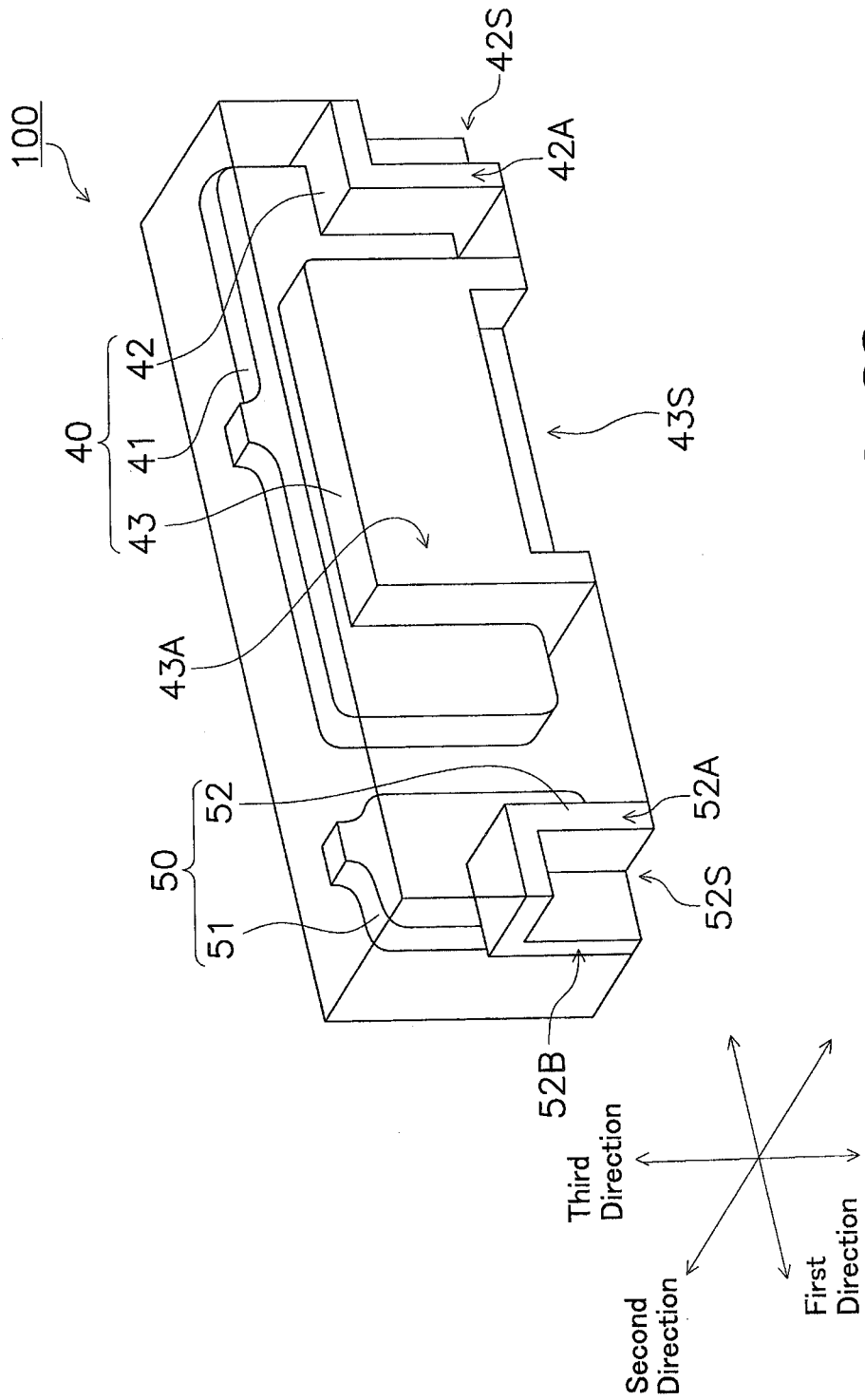
FIG. 22 is an oblique see-through view of a light emitting device 100 pertaining to a fourth embodiment, as seen from the rear.

FIG. 22 is an oblique see-through view of the light emitting device 100A pertaining to the fourth embodiment, as seen from the rear. As shown in FIG. 22, the first terminal component 42 and the second terminal component 52 of the light emitting device 100 are made taller in the third direction. Along with this, the first terminal concavity 42S and the second terminal concavity 52S are formed taller than the concavity 43S in the third direction.

Figure 23:
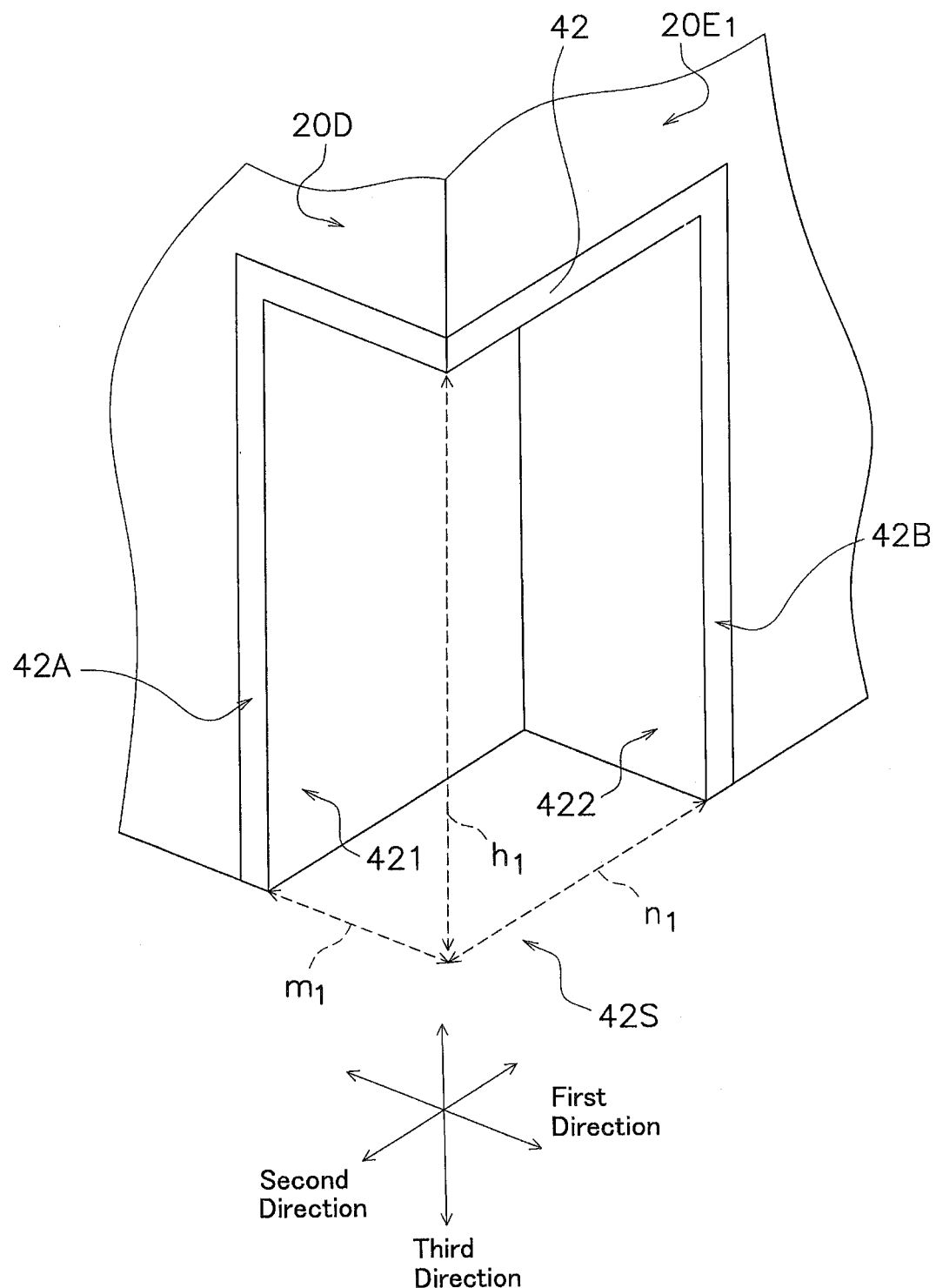
FIG. 23 is a detail oblique view of a first terminal concavity 42S pertaining to the fourth embodiment.

FIG. 23 is a detail oblique view of the first terminal concavity 42S pertaining to the fourth embodiment. As shown in FIG. 23, the height $h_1$ of the first terminal concavity 42S in the third direction (that is, a direction perpendicular to the bottom face 20A) is greater than the depth $n_1$ (>depth $m_1$) of the first terminal concavity 42S in the second direction (that is, a direction perpendicular to the rear face 20D). Also, the surface area of the first inner wall 421 is greater than the surface area of the second inner wall 422, and the difference between the two is greater than that in the first embodiment.

Figure 24:
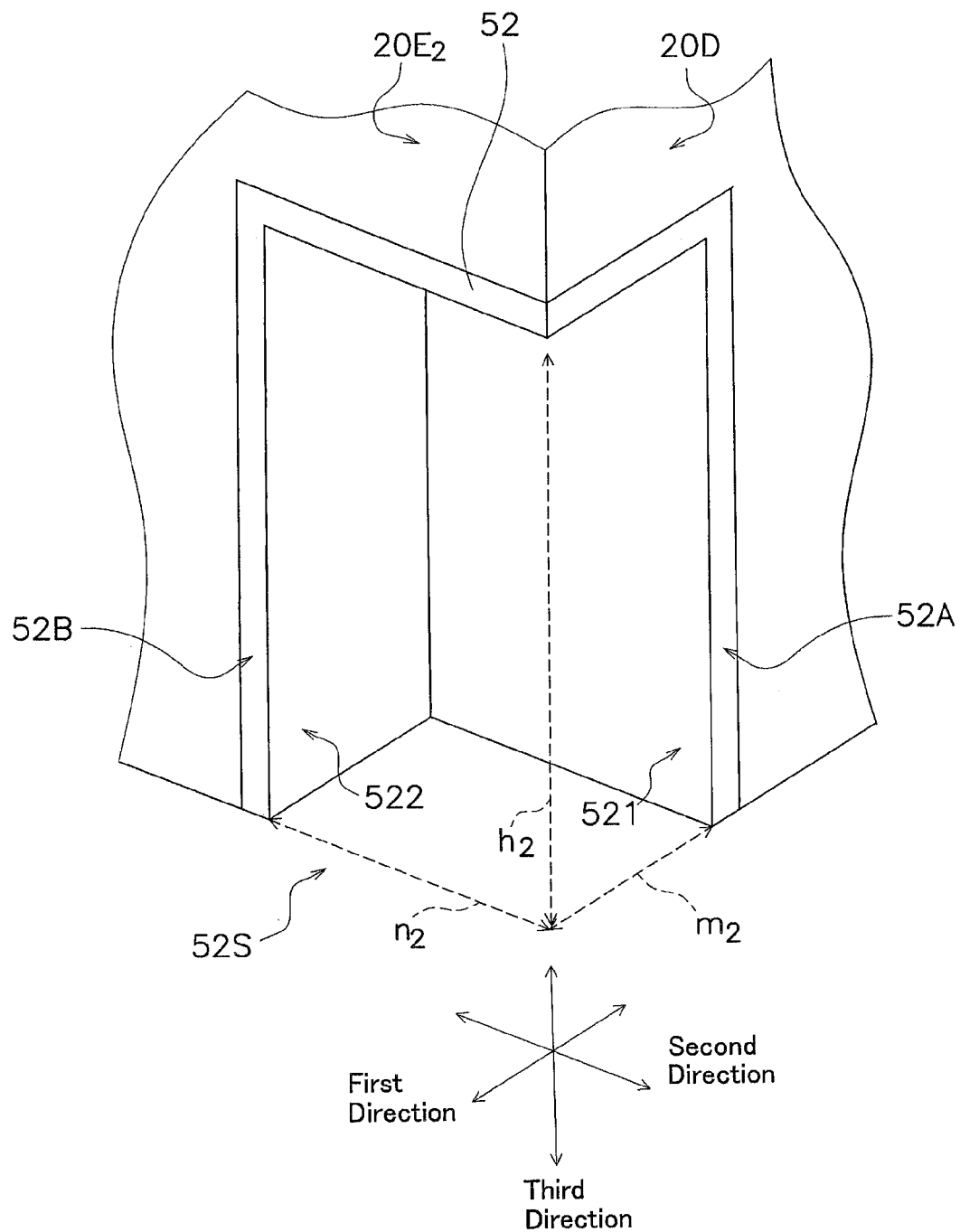
FIG. 24 is a detail oblique view of a second terminal concavity 52S pertaining to the fourth embodiment.

FIG. 24 is a detail oblique view of the second terminal concavity 52S pertaining to the fourth embodiment. As shown in FIG. 24, the height $h_2$ of the second terminal concavity 52S in the third direction is greater than the depth $n_2$ (>depth $m_2$) of the second terminal concavity 52S in the second direction. The surface area of the second inner wall 521 is greater than the surface area of the second inner wall 522, and the difference between the two is greater than that in the first embodiment.

Method for Manufacturing Light Emitting Device

Figure 25:
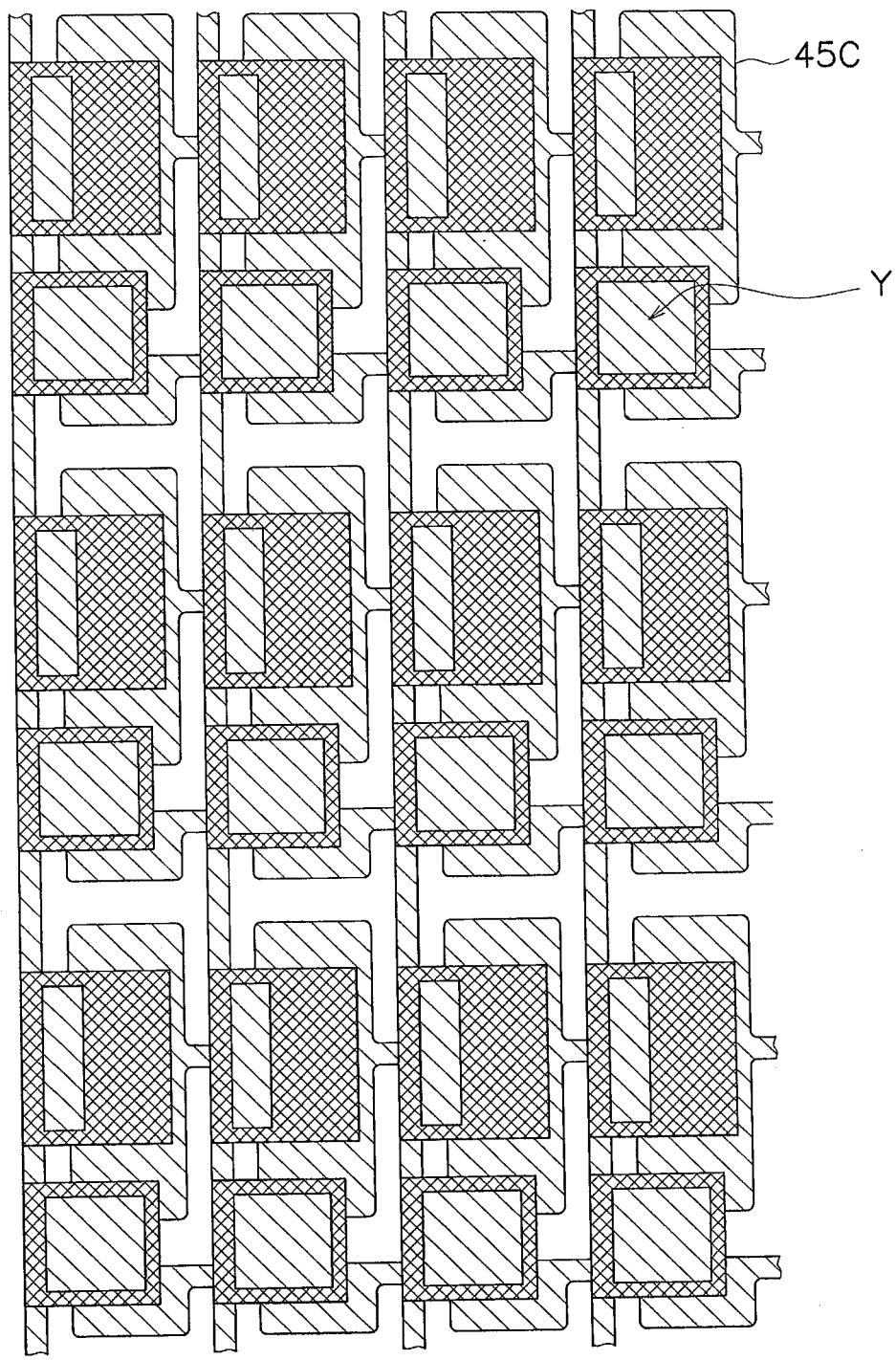
FIG. 25 is a diagram illustrating a method for manufacturing the light emitting device 100 pertaining to the fourth embodiment.

First, the lead frame 45C shown in FIG. 25 is readied. With the lead frame 45C, the one-sided etching concavity Y is set to be wider, which raises the machining limit in terms of the size that can undergo one-sided etching.

Next, the lead frame 45C is embedded in a molded board 46 by transfer molding (see FIG. 15).

Next, a dicing saw is used to cut the lead frame 45C and the molded board 46 together along cutting lines of a specific width (see FIG. 15).

Action and Effect

In the light emitting device 100 pertaining to the fourth embodiment, the height $h_1$ of the first terminal concavity 42S is greater than the depth $n_1$ of the first terminal concavity 42S.

Since the first terminal concavity 42S is thus formed taller, there is a greater difference between the surface area of the first inner wall 421 and the surface area of the second inner wall 422. Along with this, there is a greater difference between the force at which the first solder fillet 301 pulls the light emitting device 100 toward the first side face $20E_1$ side and the force at which the first solder fillet 301 pulls the light emitting device 100 toward the rear face 20D side, and this difference increases stability of the light emitting device 100 in the first direction.

Also, the same effect can be obtained by making the height $h_2$ of the second terminal concavity 52S greater than the depth $n_2$ of the second terminal concavity 52S.

Fifth Embodiment

Next, a fifth embodiment will be described through reference to the drawings. The difference between the first and fifth embodiments is that a part of each of the first lead 40 and the second lead 50 extends toward the rear face 20D. The following description will focus on this difference.

Configuration of Light Emitting Device

Figure 26:
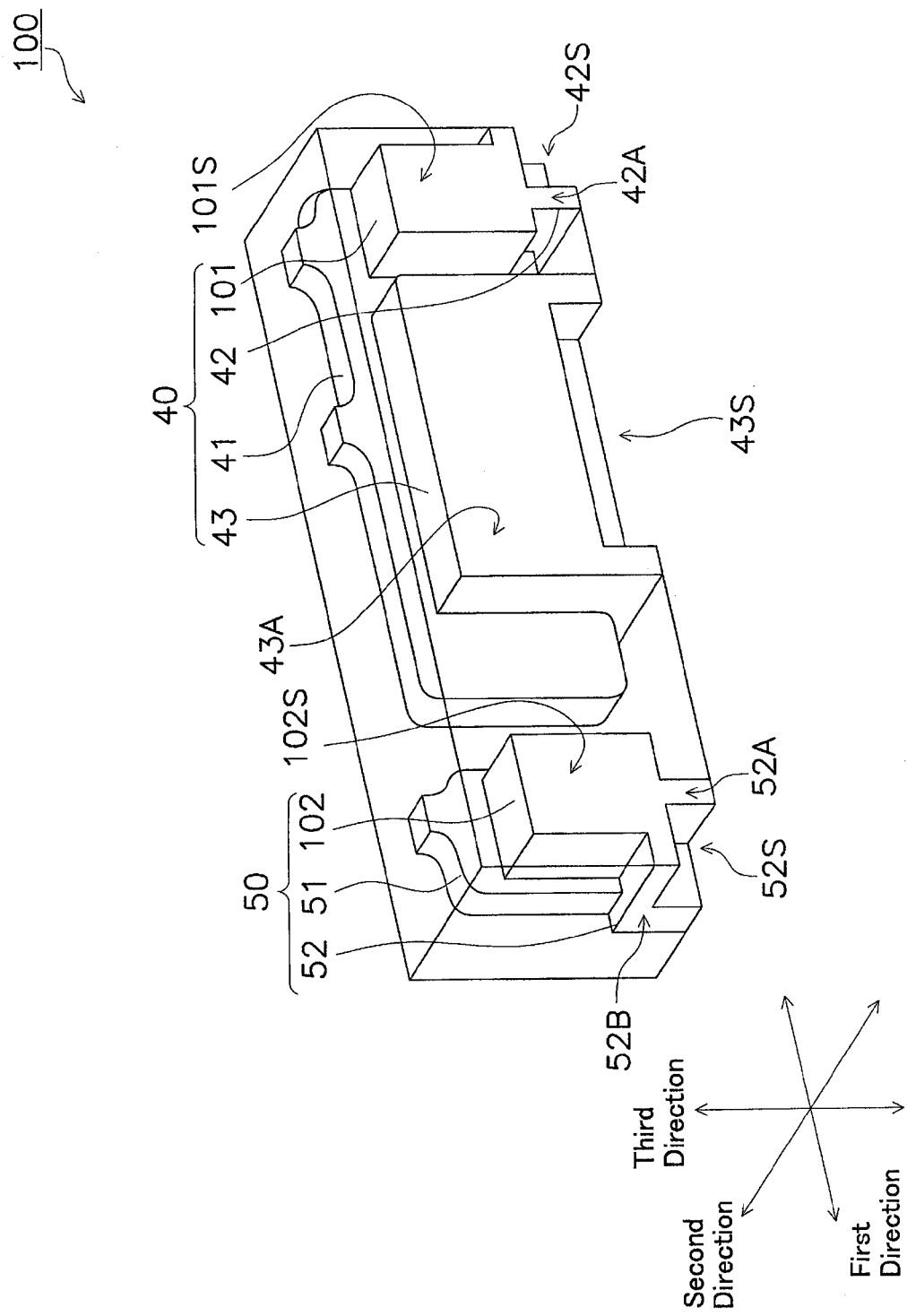
FIG. 26 is an oblique see-through view of a light emitting device 100 pertaining to a fifth embodiment, as seen from the rear.

FIG. 26 is an oblique see-through view of a light emitting device 100 pertaining to a fifth embodiment, as seen from the rear. As shown in FIG. 26, with the light emitting device 100, the first lead 40 has a first extension 101, and the second lead 50 has a second extension 102.

The first extension 101 is disposed on the first connector 41, and is connected to the first terminal part 42. The first extension 101 extends from the surface of the first connector 41 on the rear face 20D side, toward the rear face 20D, and is exposed from the molded article 30 at the rear face 20D. The first extension 101 has a first extension face 101S that forms part of the rear face 20D.

The second extension 102 is disposed on the second connector 51, and is connected to the second terminal part 52. The second extension 102 extends from the surface of the second connector 51 on the rear face 20D side, toward the rear face 20D, and is exposed from the molded article 30 at the rear face 20D. The second extension 102 has a second extension face 102S that forms part of the rear face 20D.

Method for Manufacturing Light Emitting Device

Figure 27:
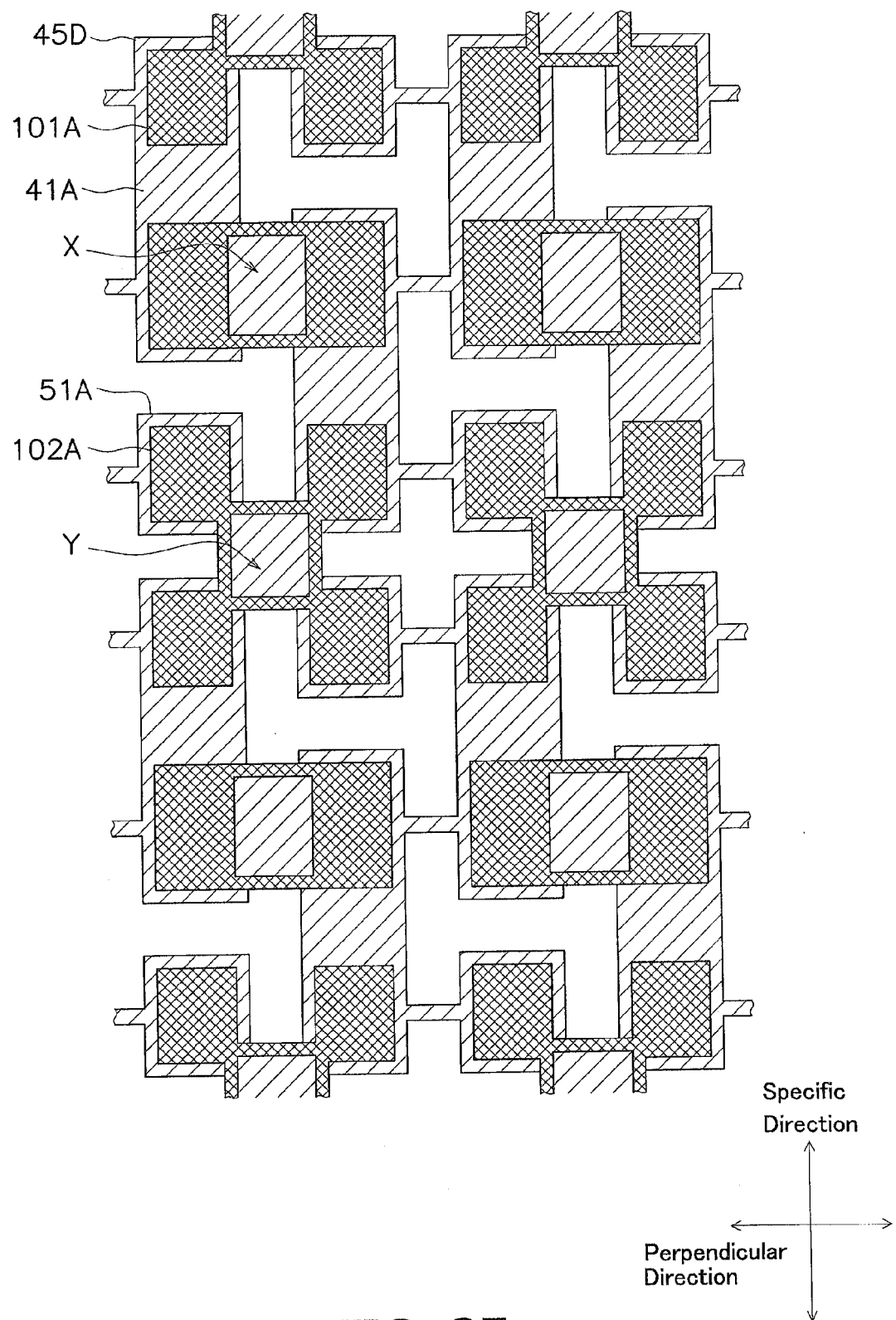
FIG. 27 is a diagram illustrating a method for manufacturing the light emitting device 100 pertaining to the fifth embodiment.

First, the lead frame 45D shown in FIG. 27 is readied. The lead frame 45D comprises a first extension base 101A and a second extension base 101B. This lead frame 45D can be formed by setting the region in which one-sided etching is performed in order to form a first connection face 41A and a second connection face 51A, as shown in FIG. 17.

With the lead frame 45D pertaining to this embodiment, the one-sided etching concavities X and the one-sided etching concavities Y (an example of "concavity") are set to be larger than the lead frame 45 pertaining to the first embodiment. This raises the dimensional machining limit at which one-sided etching is possible.

Figure 28:
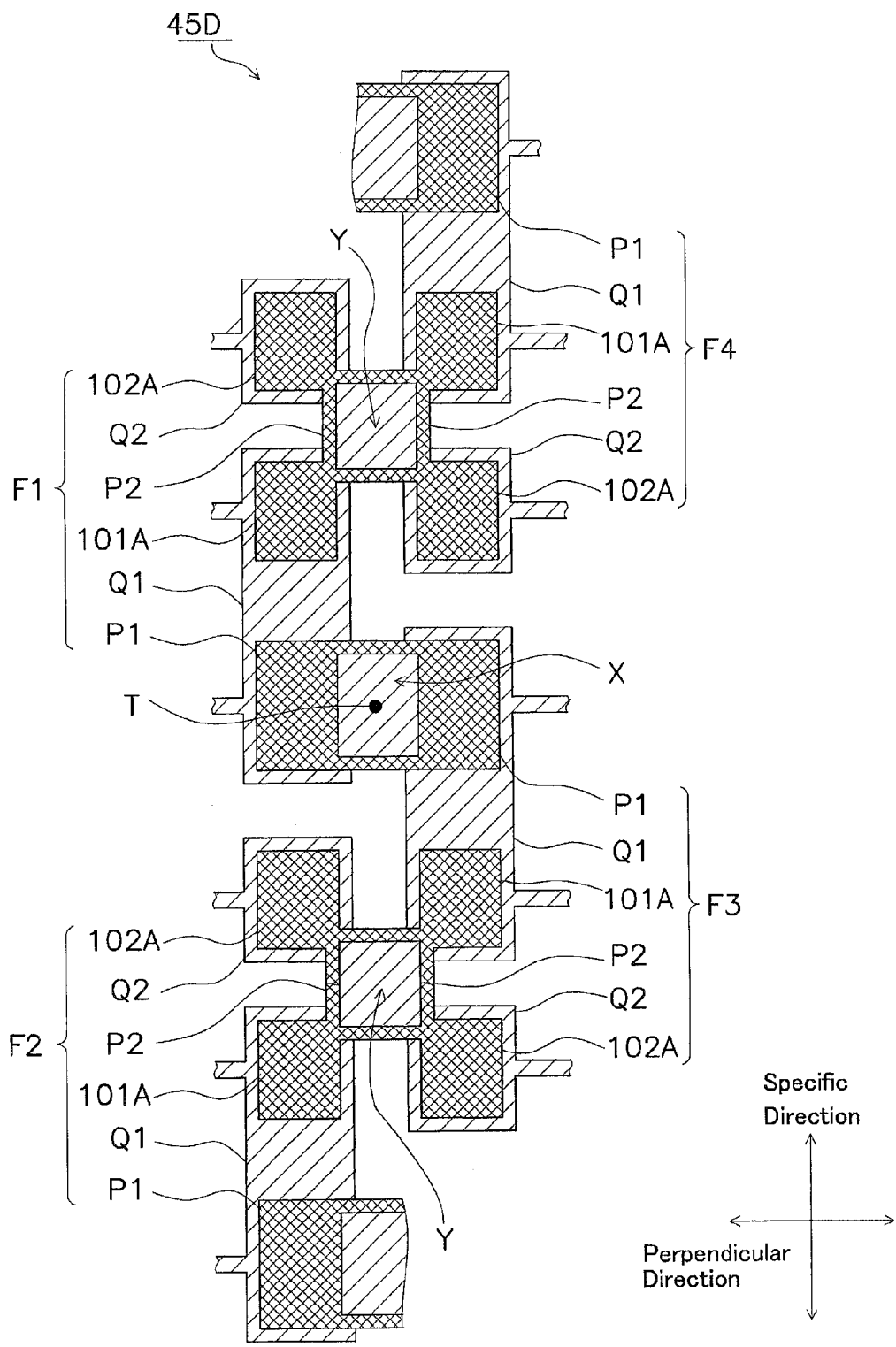
FIG. 28 is a detail view of a lead frame 45C pertaining to the fifth embodiment.

Thus, the lead frame 45D pertaining to this embodiment has a fundamentally different configuration from that of the lead frame 45 pertaining to the first embodiment. The detailed configuration of the lead frame 45D will now be described through reference to the drawings. FIG. 28 is a detail view of a lead frame 45D. As shown in FIG. 28, the lead frame 45D has first to fourth frame parts F1 to F4. The first frame part F1 and the second frame part F2 are adjacent to each other in a specific direction, but are not linked. Similarly, the third frame part F3 and the fourth frame part F4 are adjacent to each other in a specific direction, but are not linked.

In this embodiment, the third frame part F3 and the fourth frame part F4 are disposed in rotational symmetry with respect to the first frame part F1 and the second frame part F2 around an axis T that is parallel to the thickness direction (a direction that is perpendicular to the specific direction and the perpendicular direction, that is, a direction that is perpendicular to the plane of the drawing). The first thick part P1 of the third frame part F3 is directly linked to the first thick part P1 of the first frame part F1. The second thick part P2 of the third frame part F3 is directly linked to the second thick part P2 of the second frame part F2. The second thick part P2 of the fourth frame part F4 is directly linked to the second thick part P2 of the first frame part F1.

Also, in this embodiment, in a plan view of the lead frame 45D, part of the etching concavities H is formed on the inside of the first thick part P1 of the frame parts F. Consequently, the one-side etching concavities X are formed by linking the first thick part P1 of the third frame part F3 and the first thick part P1 of the first frame part F1.

In this embodiment, in a plan view of the lead frame 45D, part of the etching concavities H is formed on the inside of the second thick part P2 of the frame parts. Consequently, the one-side etching concavities Y are formed by linking the second thick part P2 of the first frame part F1 and the second thick part P2 of the fourth frame part F4. Similarly, the one-side etching concavities Y are formed by linking the second thick part P2 of the second frame part F2 and the second thick part P2 of the third frame part F3.

Figure 29:
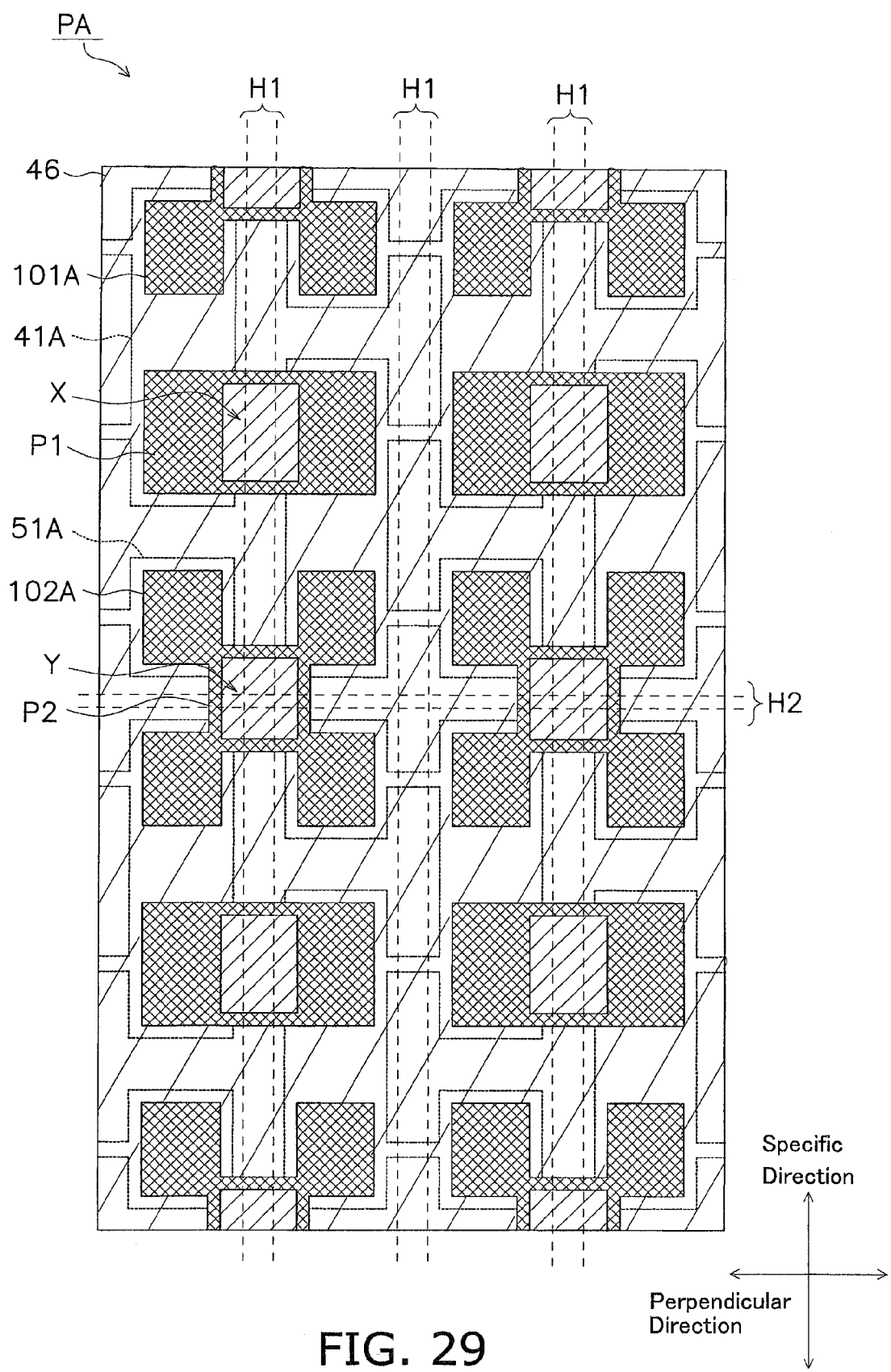
FIG. 29 is a diagram illustrating a method for manufacturing the light emitting device 100 pertaining to the fifth embodiment.

The portion where the first thick part P1 of the third frame part F3 and the first thick part P1 of the first frame part F1 are linked constitutes a cutting allowance for dicing (see FIG. 29). Similarly, the portion where the second thick part P2 of the third frame part F3 and the second thick part P2 of the second frame part F2 are linked constitutes a cutting allowance for dicing. The portion where the second thick part P2 of the fourth frame part F4 and the second thick part P2 of the first frame part F1 are linked also constitutes a cutting allowance for dicing.

Next, as shown in FIG. 28, the light emitting device package array PA is completed by embedding the lead frame 45D in a molded board 46 by transfer molding. It should be noted that the first thick part P1 and the one-side etching concavities X, and the second thick part P2 and the one-side etching concavities Y (an example of "concavity") are exposed from the molded board 46 in the light emitting device package array PA.

Next, as shown in FIG. 29, the light emitting device package array PA is cut with a dicing saw along cutting lines H1 and H2 having a specific width. Here, the first terminal concavity 42S and the second terminal concavity 52S are formed by cutting the one-side etching concavities Y in a cross shape.

Action and Effect

In the light emitting device 100 pertaining to the fifth embodiment, the first lead 40 has the first extension 101. The first extension 101 is disposed on the first connector 41, and is connected to the first terminal component 42. The first extension 101 is exposed from the molded article 30 at the rear face 20D.

Since the first extension 101 is thus connected to the first terminal component 42, a heat dissipation path of "light emitting element 10→first connector 41→first extension 101→first terminal component 42→mounting board 200" can be formed. Accordingly, heat generated from the light emitting element 10 can be released more efficiently from the light emitting device 100.

Also, since the first extension 101 is exposed from the molded article 30 at the rear face 20D, a heat dissipation path of "light emitting element 10→first connector 41→first extension 101→first extension face 101S→outside air" can be formed. Accordingly, heat generated from the light emitting element 10 can be released more efficiently from the light emitting device 100.

The fact that the first extension face 101S is exposed on the outermost face of the molded article 30 means that the first extension 101 comes into contact with the inner face of the mold in the course of manufacturing the molded article 30. Therefore, the first connector 41 is supported by the first extension 101, so the tiny vibrations of the first connector 41 caused by the injected resin material can be suppressed. Therefore, the resin material can work its way evenly around the first connector 41, so there is better adhesion between the molded article 30 and the first lead 40.

Also, in the light emitting device 100 pertaining to the fifth embodiment, the second lead 50 has the second extension 102. The second extension 102 is disposed on the second connector 51, and is connected to the second terminal component 52. The second extension 102 is exposed from the molded article 30 at the rear face 20D.

Therefore, just as with the effect produced by the above-mentioned first extension 101, a heat dissipation path of "light emitting element 10→molded article 30 and second wire 12→second connector 51→second extension 102→second terminal component 52 mounting board 200," and a heat dissipation path of "light emitting element 10→molded article 30 and second wire 12→second connector 51→second extension 102→second extension face 102S→outside air" can be formed. Also, when the second extension 102 hits the inner face of the mold, this suppresses the tiny vibrations of the second connector 51 caused by the injected resin material.

Other Embodiments

The present invention was described by the above embodiments, but the text and drawings that make up part of this disclosure should not be construed as limiting this invention. Various alternative embodiments, working examples, and applied technology will be apparent to a person skilled in the art from this disclosure.

Figure 11:
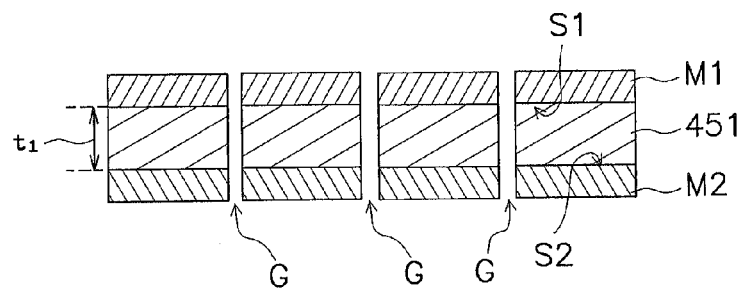
FIG. 11 is a diagram illustrating a method for manufacturing the light emitting device 100 pertaining to the first embodiment.
Figure 11:
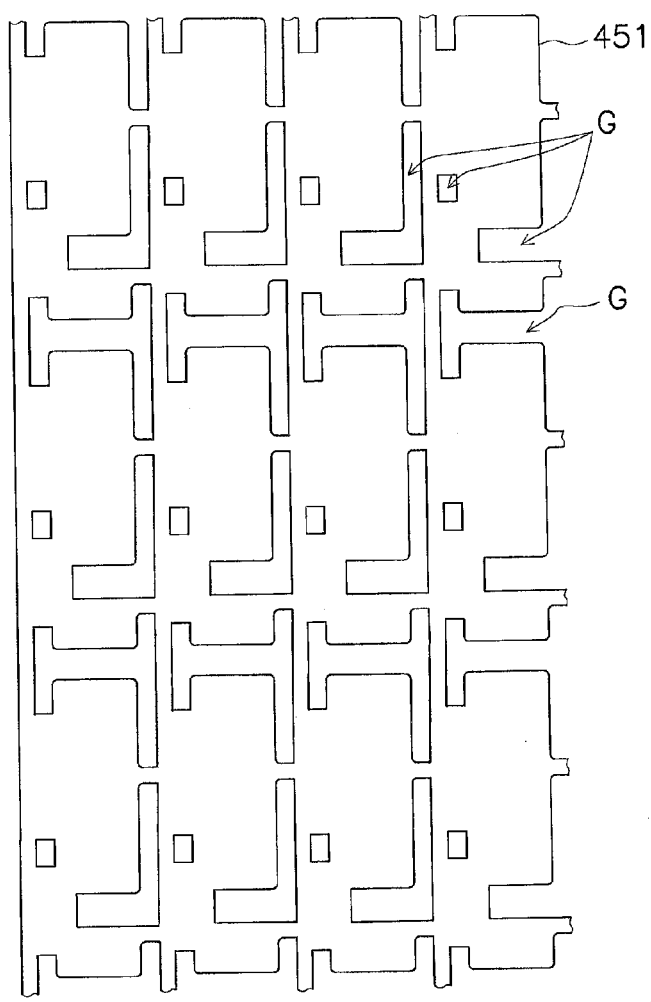

(A) In the second embodiment above, the extension 400 or 410 was formed by using the lead frame 45A shown in FIG. 14 or the lead frame 45B shown in FIG. 15, but the extension 400 can instead be formed by using the lead frame 45 shown in FIG. 11. More specifically, as shown in FIG. 13, when the lead frame 45 and the molded board 46 are cut along the cut line G2 with a dicing saw, the blade of the dicing saw is rotated from the front side to the rear in the drawing, and from the right to the left. This allows flash to be formed that extends into the first terminal concavity 42S and can be utilized as the extension 400.

(B) Although not specifically mentioned in the above embodiment, the first lead 40 may have an extension (not shown) that extends to the opening on the rear face side of the first terminal concavity 42S. Similarly, the second lead 50 may have an extension (not shown) that extends to the opening on the rear face side of the second terminal concavity 52S and is contiguous with the rear face 20D.

(C) In the above embodiments, the base part 43 had the concavity 43S, but this is not the only option. The base part 43 need not have the concavity 43S. Here again, heat can be effectively dispersed from the first exposed face 43A and the second exposed face 43B. In this case, if the third solder fillets 303 are not provided, then the third land 203 need not be formed on the mounting board 200.

(D) In the above embodiments, the base part 43 was L-shaped, and extended from the bottom face 20A side of the first connector 41 to the rear face 20D side, but this is not the only option. The base part 43 may be disposed on the bottom face 20A side of the first connector 41, and not extend to the rear face 20D side of the first connector 41. Specifically, the base part 43 may be a flat member that is disposed parallel to the bottom face 20A side of the first connector 41.

(E) In the above embodiments, the base part 43 was exposed from the molded article 30 at the bottom face 20A and the rear face 20D of the package 20, but this is not the only option. The base 43 may be exposed only at the bottom face 20A or the rear face 20D, or may be exposed at both the bottom face 20A and the rear face 20D.

(F) In the above embodiments, the base part 43 was L-shaped, but this is not the only option. The base part 43 may have a flat shape, a rod shape, a cylindrical shape, or some other, more complicated shape.

(G) In the above embodiments, the first terminal part 42 and the base part 43 were each formed in a three-dimensional shape, but this is not the only option. The shapes of the first terminal part 42 and the base part 43 can be modified as needed.

(H) In the above embodiment, the depth $m_1$ of the first terminal concavity 42S in the first direction was less than the depth $n_1$ of the first terminal concavity 42S in the second direction, but this is not the only option. The depth $m_1$ and the depth $n_1$ may also be about the same.

Similarly, the depth $m_2$ of the second terminal concavity 52S in the first direction may be about the same as the depth $n_2$ of the second terminal concavity 52S in the second direction.

(I) In the above embodiment, as shown in FIG. 10, the first solder fillet 301 was in contact with the first end face 42A and the second end face 42B of the first terminal component 42, but this is not the only option. As long as it is held in the first terminal concavity 42S, the first solder fillet 301 may be in contact with just the first end face 42A or the second end face 42B, rather than being in contact with both.

Similarly, the second solder fillet 302 was in contact with the 52A and the second end face 52B of the second terminal component 52, but this is not the only option. As long as it is held in the second terminal concavity 52S, the second solder fillet 302 may be in contact with just the first end face 52A or the second end face 52B, rather than being in contact with both.

(J) In the above embodiment, the lead frame 45 was formed by etching a thin metal plate, but this is not the only option. For example, the lead frame 45 can instead be formed by punching out a plurality of thin metal plates into the desired shape, and then compression bonding these thin metal plates together.

Thus, the present invention of course encompasses various embodiments, etc., that are not discussed herein. Therefore the technological scope of the present invention is defined only by the invention-defining matters pertaining to the appropriate claims from the above description.

The technology disclosed herein can be utilized in the field of light emitting devices because it suppresses a reduction in the quantity of light and a decrease in strength.

REFERENCE SIGNS LIST 100 light emitting device; 10 light emitting element; 11 first wire; 12 second wire; 20 package; 20A bottom face; 20B top face; 20C front face; 20D rear face; $20E_1$ first side face; $20E_2$ second side face; 20F front face opening; 30 molded article; 40 first lead; 41 first connector; 42 first terminal part; 43 base part; 43S concavity; 43A first exposed face; 43B second exposed face; 45 lead frame; 451 thin metal plate; 46 molded board; 50 second lead; 51 second connector; 52 second terminal part; 60 sealing resin; 200 mounting board; 200A mounting face; 201 first land; 202 second land; 203 third land; 204 electrical circuit; 300 circuit board; 301 first solder fillet; 302 second solder fillet; 303a, 303b third solder fillet; 400,410 extension; 401,411 extension base; S main face; M mask; F frame part; G etching hole; H etching concavity; P thick part; Q thin part; R linking frame; PA light emitting device package array; and X,Y one-sided etching concavity.

What is claimed is:

1. A light emitting device, comprising:
a package constituted by a molded article and first and second leads, the first and second leads being each embedded in the molded article, the package formed in a substantially cuboid shape; and
a light emitting element installed in the package, wherein
the package includes a bottom face, a top face opposite to the bottom face, a light emission face contiguous with the bottom face and the top face, a rear face opposite to the light emission face, a first side face contiguous with the bottom face, the top face and the light emission face, and a second side face opposite to the first side face,
the first lead has a first terminal component exposed from the molded article at a boundary between the first side face, the bottom face, and the rear face of the package,
the second lead has a second terminal component exposed from the molded article at a boundary between the second side face, the bottom face, and the rear face,
the first terminal component having a first terminal concavity continuously opening on the first side face, the bottom face, and the rear face,
the second terminal component having a second terminal concavity continuously opening on the second side face, the bottom face, and the rear face,
the molded article covers an entirety of a light emission face side and at least a part of a top face side of the first terminal component, and
the molded article covers an entirety of a light emission face side and at least a part of a top face side of the second terminal component.

2. The light emitting device according to claim 1, wherein a depth of the first terminal concavity in a direction perpendicular to the first side face is less than a depth of the first terminal concavity in a direction perpendicular to the rear face.

3. The light emitting device according to claim 2, wherein a height of the first terminal concavity in a direction perpendicular to the bottom face is greater than the depth of the first terminal concavity in a direction perpendicular to the rear face.

4. The light emitting device according to claim 1, wherein a depth of the second terminal concavity in a direction perpendicular to the second side face is less than a depth of the second terminal concavity in a direction perpendicular to the rear face.

5. The light emitting device according to claim 4, wherein a height of the second terminal concavity in a direction perpendicular to the rear face is greater than the depth of the second terminal concavity in direction perpendicular to the rear face.

6. The light emitting device according to claim 1, wherein the first terminal component includes a first extension that extends in the opening on the first side face side of the first terminal concavity.

7. The light emitting device according to claim 1, wherein the second terminal component includes a second extension that extends in the opening on the second side face side of the second terminal concavity.

8. The light emitting device according to claim 1, wherein the first lead has:
a connector that is electrically connected to the light emitting element; and
a base that is linked to the lower end of the connector.

9. The light emitting device according to claim 8, wherein the base is exposed from the molded article at the bottom face.

10. The light emitting device according to claim 8, wherein
the basis is exposed form the molded article at the rear face.

11. The light emitting device according to claim 8, wherein
a center of gravity of the base is located toward the bottom face side from the center of the molded article in a direction perpendicular to bottom face.

12. A package array for a light emitting device, comprising:
   a molded board made of resin; and
   a lead frame embedded in the molded board, the lead frame formed in a thin plate shape, the lead frame having a first frame component and a second frame component adjacent to the first frame component in a specific direction,
   the first frame component and the second frame component each including:
   a first thick part having a first thickness and exposed from the molded board;
   a second thick part having the first thickness and exposed from the molded board, the second thick part being separated from the first thick part in the specific direction;
   a first thin part having a second thickness less than the first thickness and directly contacting with the first thick part and the second thick part; and
   a second thin part having the second thickness and directly contacting with the second thick part, the first thin part and the second thin part being disposed on the same side of the first thick part and the second thick part with the second thin part being separated from the first thin part in the specific direction;
   the second thick part includes a concavity part having the second thickness, the concavity part being exposed from the molded board.

13. The package array for a light emitting device according to claim 12, wherein
   the lead frame has a third frame component and a fourth frame component that have the same configuration as the first frame component and second frame component,
   the third frame component and the fourth frame component are disposed in rotational symmetry to the first frame component and the second frame component around an axis parallel to a thickness direction,
   the first thick part of the third frame component is linked to the first thick part of the first frame component,
   the second thick part of the third frame component is linked to the second thick part of the second frame component, and
   the second thick part of the fourth frame component is linked to the second thick part of the first frame component.

14. The package array for a light emitting device according to claim 12, wherein
   the lead frame has a third frame component and a fourth frame component that have the same configuration as the first frame component and second frame component,
   the third frame component is adjacent to the first frame component in a perpendicular direction perpendicular to the specific direction,
   the fourth frame component is adjacent to the second frame component in the perpendicular direction,
   the first thick part of the third frame component is linked to the first thick part of the first frame component,
   the second thick part of the third frame component is linked to the second thick part of the first frame component,
   the first thin part of the fourth frame component is linked to the first thick part of the second frame component, and
   the second thin part of the fourth frame component is linked to the second thick part of the second frame component.

15. The package array for a light emitting device according to claim 12, wherein
   the second thick part is embedded in the molded board except for a side on which the concavity part is formed.

* * * * *